United States Patent
Ishii et al.

(12)

(10) Patent No.: US 10,072,928 B2
(45) Date of Patent: Sep. 11, 2018

(54) PHYSICAL QUANTITY DETECTION VIBRATOR ELEMENT, PHYSICAL QUANTITY DETECTION APPARATUS, ELECTRONIC APPARATUS, AND MOVING OBJECT

(71) Applicant: Seiko Epson Corporation, Tokyo (JP)

(72) Inventors: Masahiro Ishii, Higashiomi (JP); Keiichi Yamaguchi, Ina (JP); Takayuki Kikuchi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 136 days.

(21) Appl. No.: 15/336,404

(22) Filed: Oct. 27, 2016

(65) Prior Publication Data

US 2017/0122738 A1    May 4, 2017

(30) Foreign Application Priority Data

Oct. 28, 2015  (JP) .................................. 2015-211602

(51) Int. Cl.
   *G01C 19/5614*   (2012.01)
   *H01L 41/113*    (2006.01)
   *G01C 19/56*     (2012.01)

(52) U.S. Cl.
   CPC ......... *G01C 19/56* (2013.01); *G01C 19/5614* (2013.01); *H01L 41/1132* (2013.01)

(58) Field of Classification Search
   CPC .. G01C 19/56; G01C 19/5614; H01L 41/1132

USPC .......................................................... 73/597
See application file for complete search history.

(56) References Cited

U.S. PATENT DOCUMENTS

| | | | |
|---|---|---|---|
| 9,341,477 B2* | 5/2016 | Ichikawa ........... | G01C 19/5607 |
| 9,746,490 B2* | 8/2017 | Tanaka .................. | G01P 15/125 |
| 9,764,201 B2* | 9/2017 | Binder ................. | A63B 43/004 |
| 2007/0159029 A1 | 7/2007 | Aratake | |
| 2012/0000288 A1* | 1/2012 | Matsuura ................ | G01L 1/183 |
| | | | 73/579 |

(Continued)

FOREIGN PATENT DOCUMENTS

| | | |
|---|---|---|
| JP | 2007-158386 A | 6/2007 |
| JP | 2012-063177 A | 3/2012 |

(Continued)

*Primary Examiner* — J M Saint Surin
(74) *Attorney, Agent, or Firm* — Oliff PLC

(57) ABSTRACT

A vibrator element has a detection arm that performs a drive vibration in a Z-axis direction, and performs a detection vibration in an X-axis direction when an angular velocity is applied thereto The vibrator element also has first, second, third, and fourth electrode portions and first, second, third, and fourth ground electrode portions provided on a detection arm. Further, a signal generated between the first electrode portion and the first ground electrode portion and a signal generated between the second electrode portion and the second ground electrode portion are in opposite phase in a drive vibration and in phase in a detection vibration. Furthermore, a signal generated between the third electrode portion and the third ground electrode portion and a signal generated between the fourth electrode portion and the fourth ground electrode portion are in opposite phase in the drive vibration and in phase in the detection vibration.

20 Claims, 22 Drawing Sheets

(56) References Cited

U.S. PATENT DOCUMENTS

| | | | |
|---|---|---|---|
| 2012/0326570 A1 | 12/2012 | Nishizawa et al. | |
| 2013/0074597 A1 | 3/2013 | Ichikawa | |
| 2013/0239685 A1 | 9/2013 | Ishii | |
| 2013/0256814 A1* | 10/2013 | Tanaka | B81B 3/0021 257/415 |
| 2013/0283910 A1 | 10/2013 | Nishizawa et al. | |
| 2017/0074658 A1* | 3/2017 | Tanaka | G01C 19/5755 |

FOREIGN PATENT DOCUMENTS

| | | |
|---|---|---|
| JP | 2013-009166 A | 1/2013 |
| JP | 2013-072652 A | 4/2013 |
| JP | 2013-190304 A | 9/2013 |
| JP | 2013-231635 A | 11/2013 |

\* cited by examiner

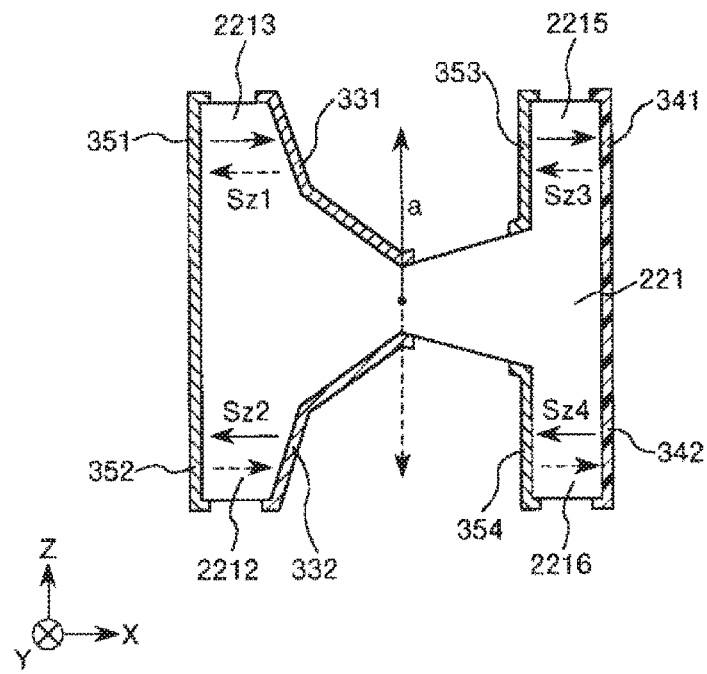
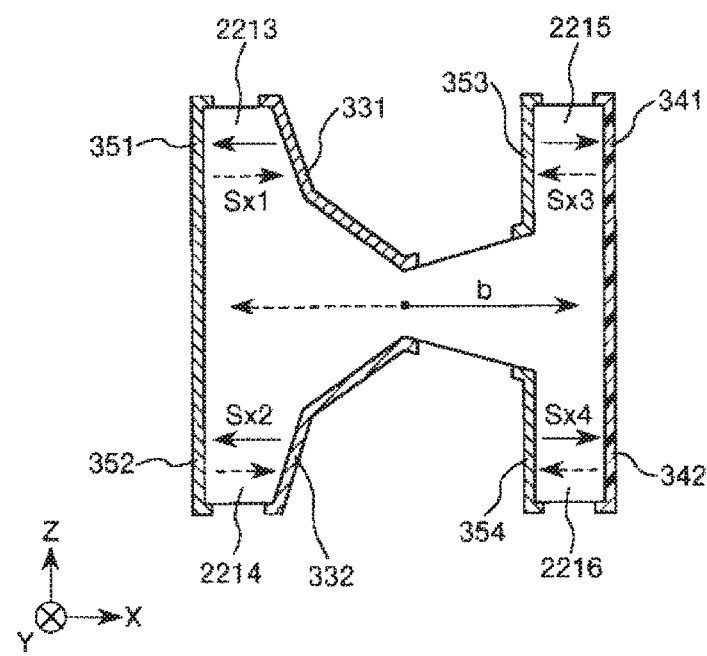
FIG. 4

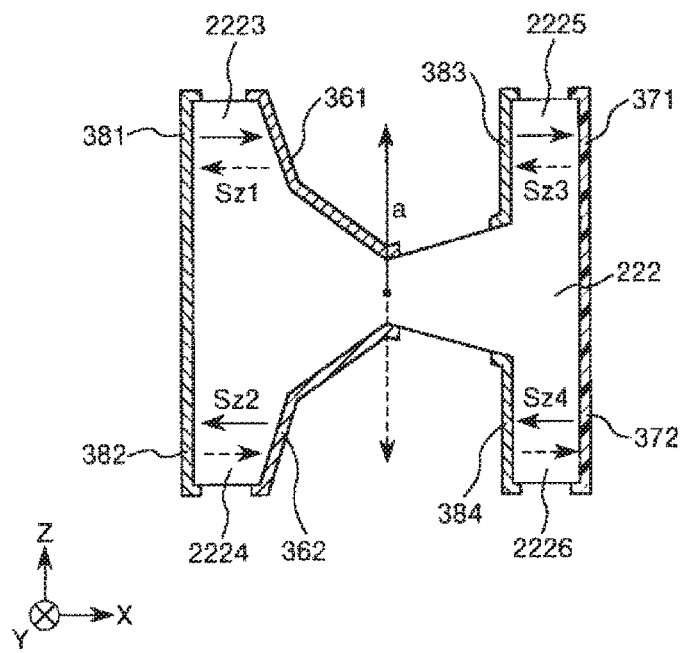
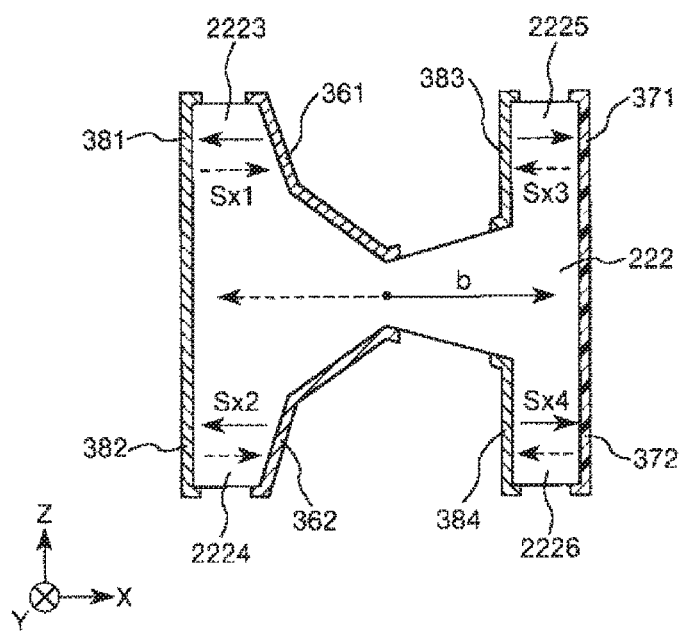
FIG. 5

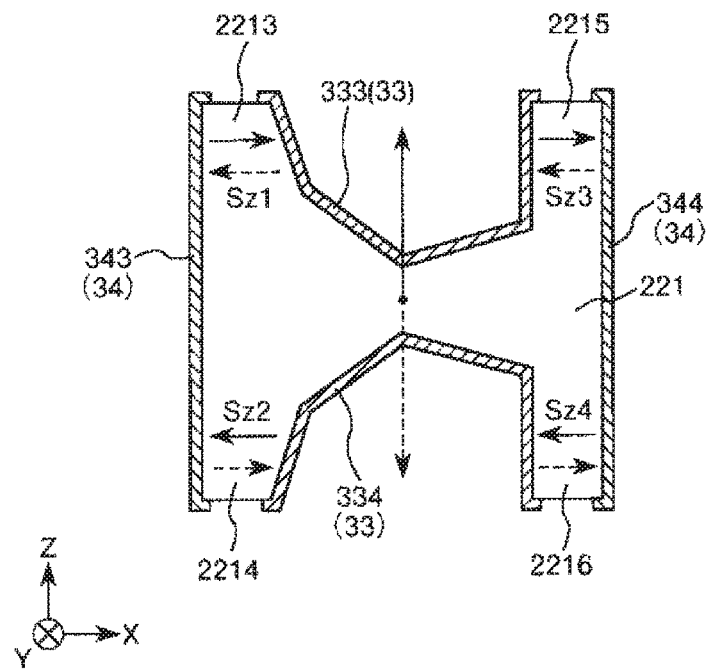
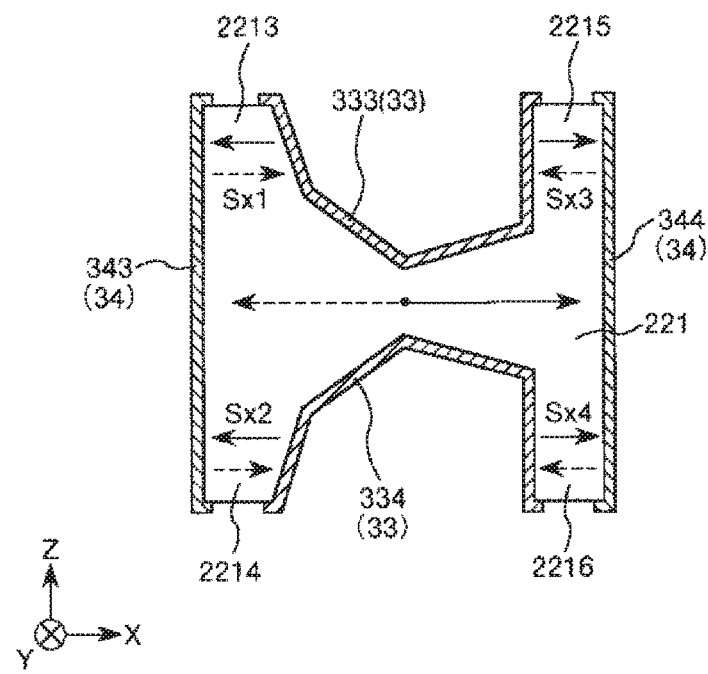
FIG. 13

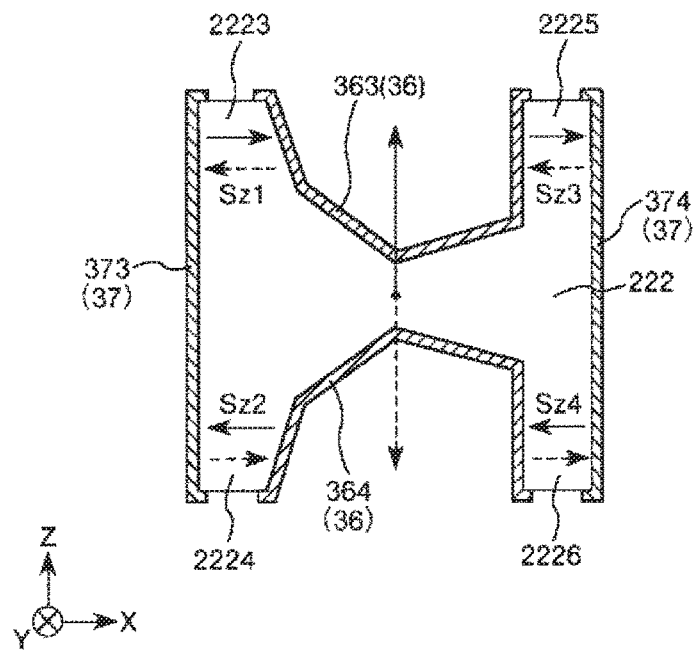
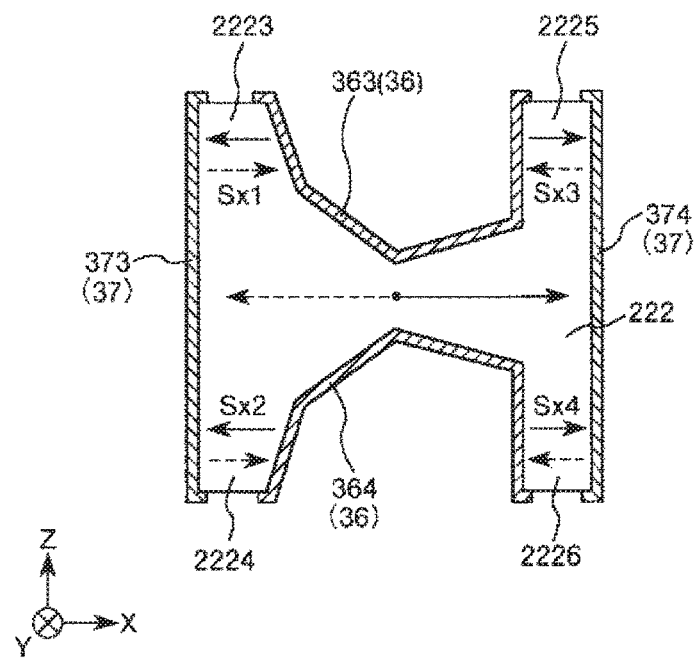
FIG. 14

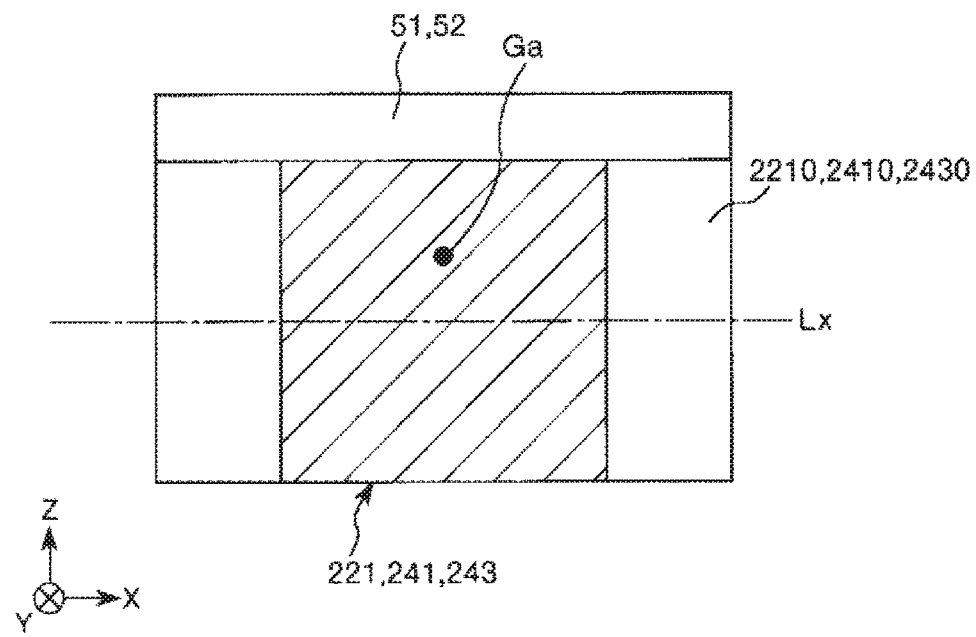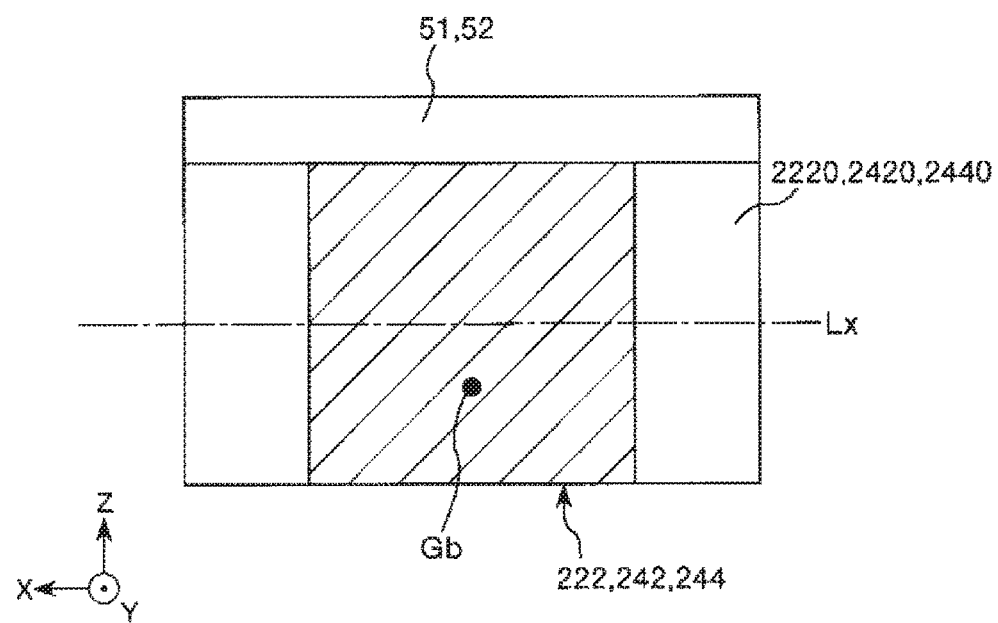
FIG. 16

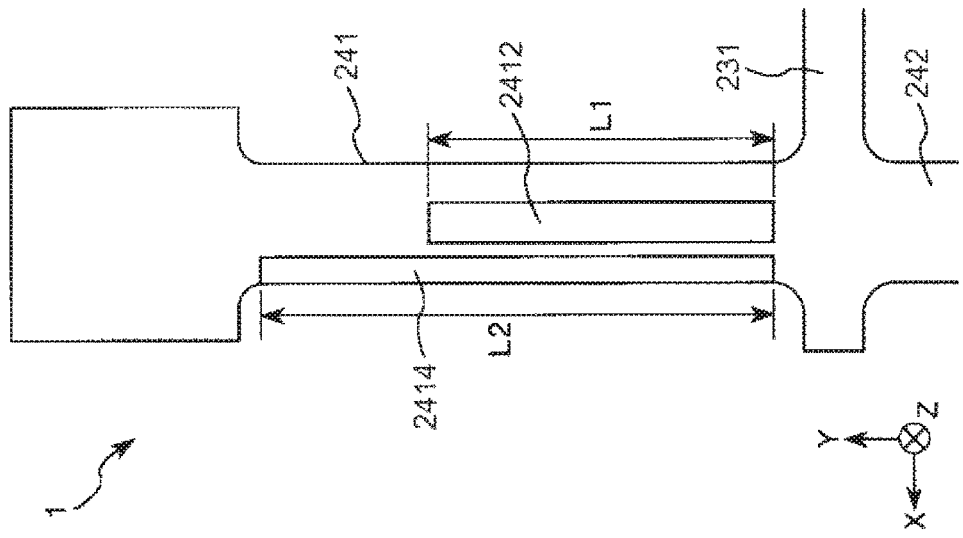
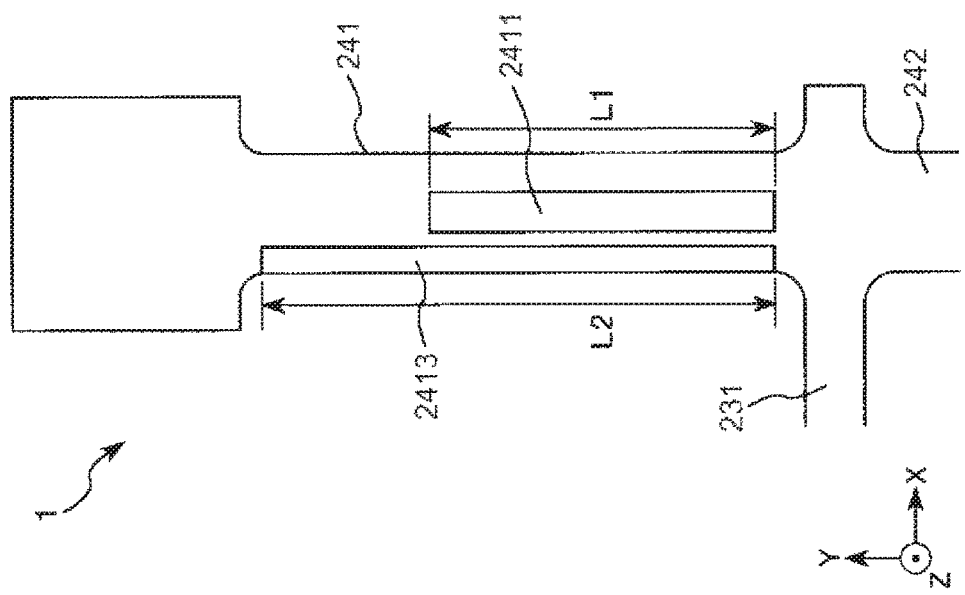
FIG. 19

… (1) …

PHYSICAL QUANTITY DETECTION VIBRATOR ELEMENT, PHYSICAL QUANTITY DETECTION APPARATUS, ELECTRONIC APPARATUS, AND MOVING OBJECT

BACKGROUND

1. Technical Field

The present invention relates to a physical quantity detection vibrator element, a physical quantity detection apparatus, an electronic apparatus, and a moving object.

2. Related Art

In related art, as an angular velocity detection vibrator element (i.e., physical quantity detector), a configuration of which is described in Patent Document 1 (JP-A-2013-190304) is known. The angular velocity detection vibrator element described in Patent Document 1 has a base part, a pair of detection arms extending from the base part toward both sides in Y-axis directions, a pair of connecting arms extending from the base part toward both sides in X-axis directions, a pair of drive arms extending from one connecting arm toward both sides in the Y-axis directions, and a pair of drive arms extending from the other connecting arm toward both sides in the Y-axis directions. The angular velocity detection vibrator element has the respective drive arms performing oblique vibrations (vibrations containing vibration components in the X-axis directions and vibration components in Z-axis directions), and may independently detect an angular velocity about the Z-axis and an angular velocity about the Y-axis. Specifically, when a detection signal extracted from a detection electrode of one detection arm is referred to as "first detection signal Sa" and a detection signal extracted from a detection electrode of the other detection arm is referred to as "second detection signal Sb", the angular velocity about the Z-axis may be detected by Sa−Sb and the angular velocity about the Y-axis may be detected by Sa+Sb.

However, actually, for example, noise Na due to capacitive coupling with the drive electrode is mixed in the first detection signal Sa and, similarly, for example, noise Nb due to capacitive coupling with the drive electrode is mixed in the second detection signal Sb. Accordingly, as described above, when the calculation processing of Sa−Sb, i.e., processing of subtracting Sb from Sa is performed for detection of the angular velocity about the Z-axis, noise Na and noise Nb are cancelled and the noise becomes smaller. On the other hand, when the calculation processing of Sa+Sb is performed for detection of the angular velocity about the Y-axis, noise Na and noise Nb are added and the noise becomes larger. As described above, in the angular velocity detection vibrator element of Patent Document 1, there is a problem that it is impossible to accurately detect both the angular velocity about the Z-axis and the angular velocity about the Y-axis.

SUMMARY

An advantage of some aspects of the invention is to provide a physical quantity detection vibrator element, a physical quantity detection apparatus, an electronic apparatus, and a moving object that may exert the better physical quantity detection sensitivity.

The invention can be implemented as the following forms or application examples.

A physical quantity detection vibrator element according to an application example includes a detection arm that includes a piezoelectric material, performs a drive vibration in a first direction, and performs a detection vibration in second direction orthogonal to the first direction when a physical quantity is applied thereto; and a first detection signal electrode, a second detection signal electrode, and a reference potential electrode provided on the detection arm; wherein: the first detection signal electrode includes a first electrode portion and a second electrode portion; the second detection signal electrode includes a third electrode portion and a fourth electrode portion; the reference potential electrode includes: (a) a first reference potential electrode portion at a reference potential with respect to the first electrode portion; (b) a second reference potential electrode portion at the reference potential with respect to the second electrode portion; (c) a third reference potential electrode portion at the reference potential with respect to the third electrode portion; and (d) a fourth reference potential electrode portion at the reference potential with respect to the fourth electrode portion; a first signal generated between the first electrode portion and the first reference potential electrode portion and a second signal generated between the second electrode portion and the second reference potential electrode portion are in opposite phase with each other when the drive vibration is performed and in phase with each other when the detection vibration is performed; and a third signal generated between the third electrode portion and the third reference potential electrode portion and a fourth signal generated between the fourth electrode portion and the fourth reference potential electrode portion are in opposite phase with each other when the drive vibration is performed and in phase with each other when the detection vibration is performed.

With this configuration, the physical quantity detection vibrator element that may effectively reduce noise mixed in the detection signals and may exert the better physical quantity detection sensitivity is obtained.

In the above described application example, a first plane is defined normal the first direction and it is preferable the detection arm further include: a first projection portion projecting away from the first plane on one side of the first plane; a second projection portion projecting away from the first plane on the other side of the first plane; a third projection portion projecting away from the first plane on the one side of the first plane beside the first projection portion; and a fourth projection portion projecting away from the first plane on the other side of the first plane beside the second projection portion, wherein the first electrode portion and the first reference potential electrode portion are provided with the first projection portion in between, the second electrode portion and the second reference potential electrode portion are provided with the second projection portion in between, the third electrode portion and the third reference potential electrode portion are provided with the third projection portion in between, and the fourth electrode portion and the fourth reference potential electrode portion are provided with the fourth projection portion in between.

With this configuration, arrangement of the respective electrodes becomes easier and the detection signals may be efficiently extracted.

A physical quantity detection vibrator element according to an application example may also include a detection arm that includes a piezoelectric material, performs a drive vibration in a first direction, and performs a detection vibration in a second direction orthogonal to the first directions when a physical quantity is applied thereto; and a first detection signal electrode and a second detection signal electrode provided on the detection arm; wherein: the first detection signal electrode includes a first electrode portion and a second electrode portion; the second detection signal electrode includes a third electrode portion and a fourth electrode portion; a signal generated between the first electrode portion and the third electrode portion and a signal generated between the second electrode portion and the third electrode portion are in opposite phase with each other when the drive vibration is performed and in phase with each other when the detection vibration is performed; and a signal generated between the first electrode portion and the fourth electrode portion and a signal generated between the second electrode portion and the fourth electrode portion are in opposite phase with each other when the drive vibration is performed and in phase with each other when the detection vibration is performed.

With this configuration, the physical quantity detection vibrator element that may effectively reduce noise mixed in the detection signals and may exert the better physical quantity detection sensitivity is obtained.

In the above described application example, a first plane may be defined normal the first direction, a second plane may be defined normal the second direction. It is further preferable that the detection arm include a detection arm first principal surface provided on one side of the first plane; a detection arm second principal surface provided on the other side of the first plane; a detection arm first side surface provided on one side of the second plane; a detection arm second side surface provided on the other side of the second plane; a detection arm first groove portion opening in the detection arm first principal surface; and a detection arm second groove portion opening in the detection arm second principal surface; wherein: the first electrode portion is provided in the detection arm first groove portion; the second electrode portion is provided in the detection arm second groove portion; the third electrode portion is provided on the detection arm first side surface; and the fourth electrode portion is provided on the detection arm second side surface.

With this configuration, the arrangement of the respective electrodes becomes easier and the detection signals may be efficiently extracted.

A preferred embodiment may further include a pair of drive arms provided with the detection arm in between, and a base part connected to the detection arm and to the drive arms are.

With this configuration, the physical quantity detection vibrator element may be driven with balance.

In the physical quantity detection vibrator element according to the application example, it is preferable that at least two of the detection arms are provided with the base part in between.

With this configuration, signal intensity may be increased. Further, different physical quantities can be independently detected using differences in vibration direction of the detection arms.

The above described application example may further include a base part; a pair of the detection arms extending from the base part in opposite directions along a third direction orthogonal to the first direction and second direction; a pair of connecting arms extend from the base in opposite directions parallel to the second plane; a first pair of drive arms extend from one connecting arm in opposite directions parallel to the first plane; and a second pair of drive arms extend from the other of the pair of connecting arms in opposite directions to each other along the first plane.

With this configuration, the physical quantity detection vibrator element may be driven with balance. Further, there are the two detection arms, and thus, the detection sensitivity is improved.

In the above described application example, it is preferable that a first weight portion be provided on a surface of the one detection arms on one side of the first plane, and a second weight portion be provided on a surface of the other detection arms on the other side of the first plane.

With this configuration, the vibrations of the pair of detection arms in the first directions are symmetric.

In the above described application example, a first plane is defined normal the first direction, a second plane is defined normal the second direction, and each of the drive arms includes: a drive arm first principal surface provided on one side of the first plane; a drive arm second principal surface provided on the other side of the first plane, a drive arm first side surface provided on one side of the second plane; a drive arm second side surface provided on the other side of the second plane; a drive arm first groove portion provided in the drive arm first principal surface; a drive arm second groove portion provided in the drive arm second principal surface; a first step portion located in the drive arm first groove portion on the one side of the second plane and connecting the drive arm first principal surface and the drive arm first side surface; and a second step portion located in the drive arm second groove portion on the other side of the second plane and connecting the drive arm second principal surface and the drive arm second side surface, a tip end of the first stepped portion in a third direction orthogonal to the first direction and second direction is located closer to a tip end side of the drive arm than a tip end of the drive arm first groove portion in the third direction; and a tip end of the second stepped portion in the third direction is located closer to a tip end side of the drive arm than a tip end of the drive arm second groove portion in the third direction.

With this configuration, the drive arm may be efficiently vibrated in oblique directions including the first directions and the second directions.

A physical quantity detection apparatus according to an application example includes the above described physical quantity detection vibrator element and a circuit electrically connected to the physical quantity detection vibrator element.

With this configuration, the physical quantity detection apparatus with higher reliability may be obtained.

An electronic apparatus according to an application example includes the above described physical quantity detection vibrator element.

With this configuration, the electronic apparatus with higher reliability may be obtained.

A moving object according to an application example includes the above described physical quantity detection vibrator element.

With this configuration, the moving object with higher reliability may be obtained.

BRIEF DESCRIPTION OF THE DRAWINGS

The invention will be described with reference to the accompanying drawings, wherein like numbers reference like elements.

FIG. 4 is a sectional view showing directions of electric fields generated in detection arms by flexural vibrations.

FIG. 5 is a sectional view showing directions of electric fields generated in the detection arms by flexural vibrations.

FIG. 13 is a sectional view showing directions of electric fields generated in detection arms by flexural vibrations.

FIG. 14 is a sectional view showing directions of electric fields generated in the detection arms by flexural vibrations.

FIG. 16 is a sectional view showing centers of gravity of arms.

FIG. 19 is a top view and a bottom view of a physical quantity detection vibrator element according to a fifth embodiment of the invention.

DESCRIPTION OF EXEMPLARY EMBODIMENTS

As below, a physical quantity detection vibrator element, a physical quantity detection apparatus, an electronic apparatus, and a moving object according to the invention will be explained in detail based on embodiments shown in the accompanying drawings. Examples of a physical quantity include movement, force, momentum, velocity, etc., as known in the art. In the below examples, the physical quantity detected is angular velocity.

First Embodiment

First, a physical quantity detection vibrator element according to the first embodiment of the invention is explained.

Figure 1:
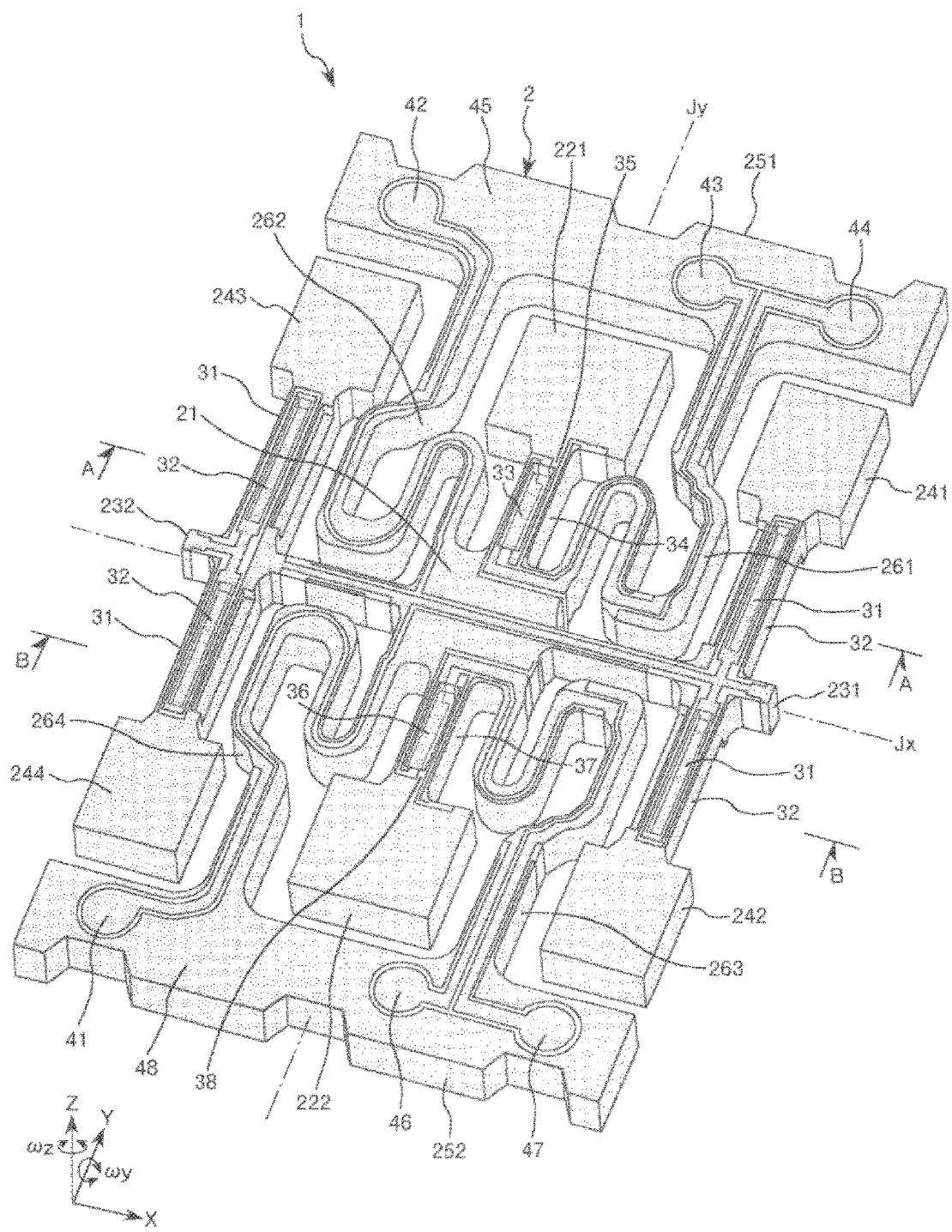
FIG. 1 is a perspective view of a physical quantity detection vibrator element according to a first embodiment of the invention.
Figure 2:
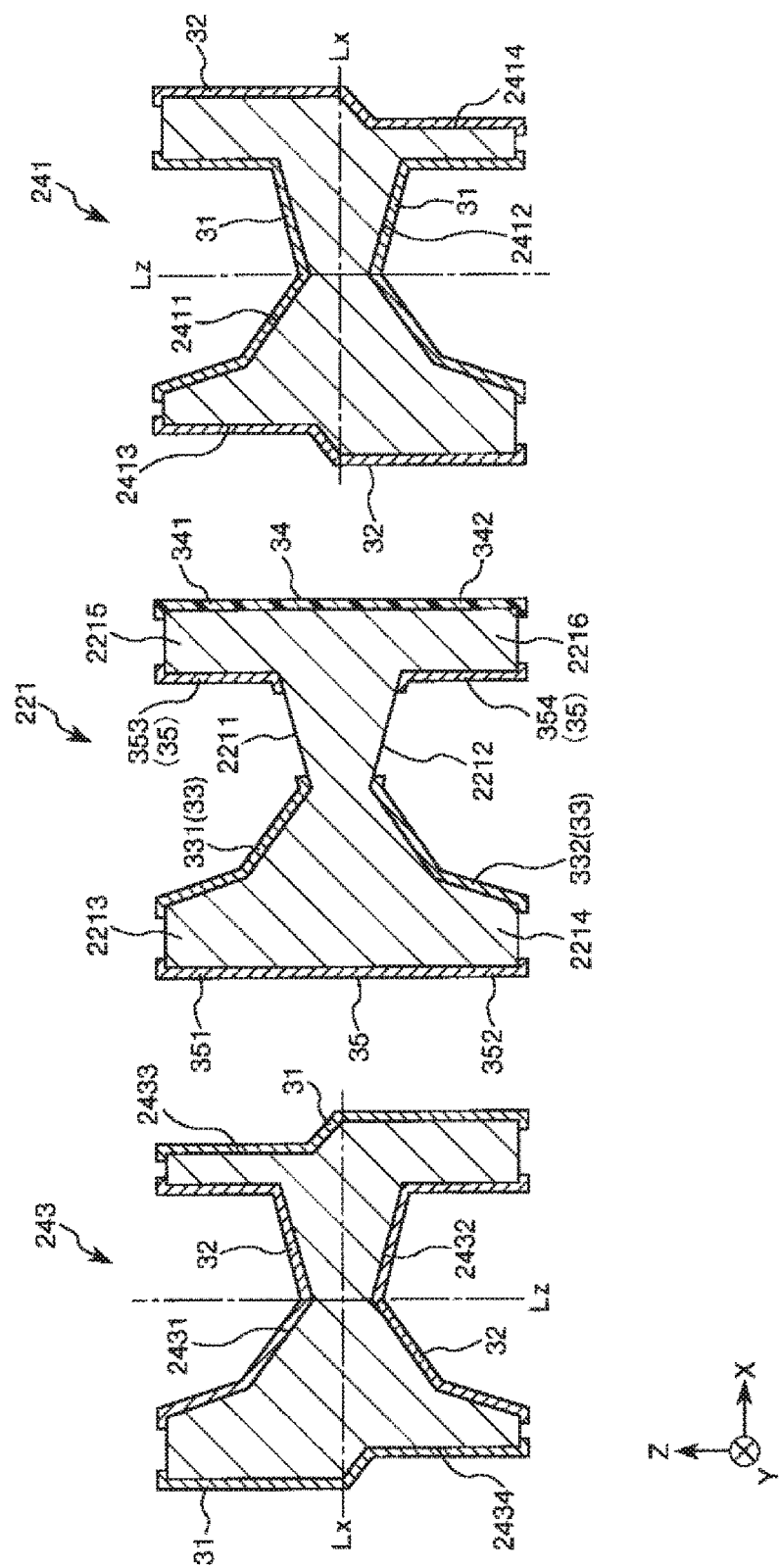
FIG. 2 is a sectional view along line A-A in FIG. 1.
Figure 3:
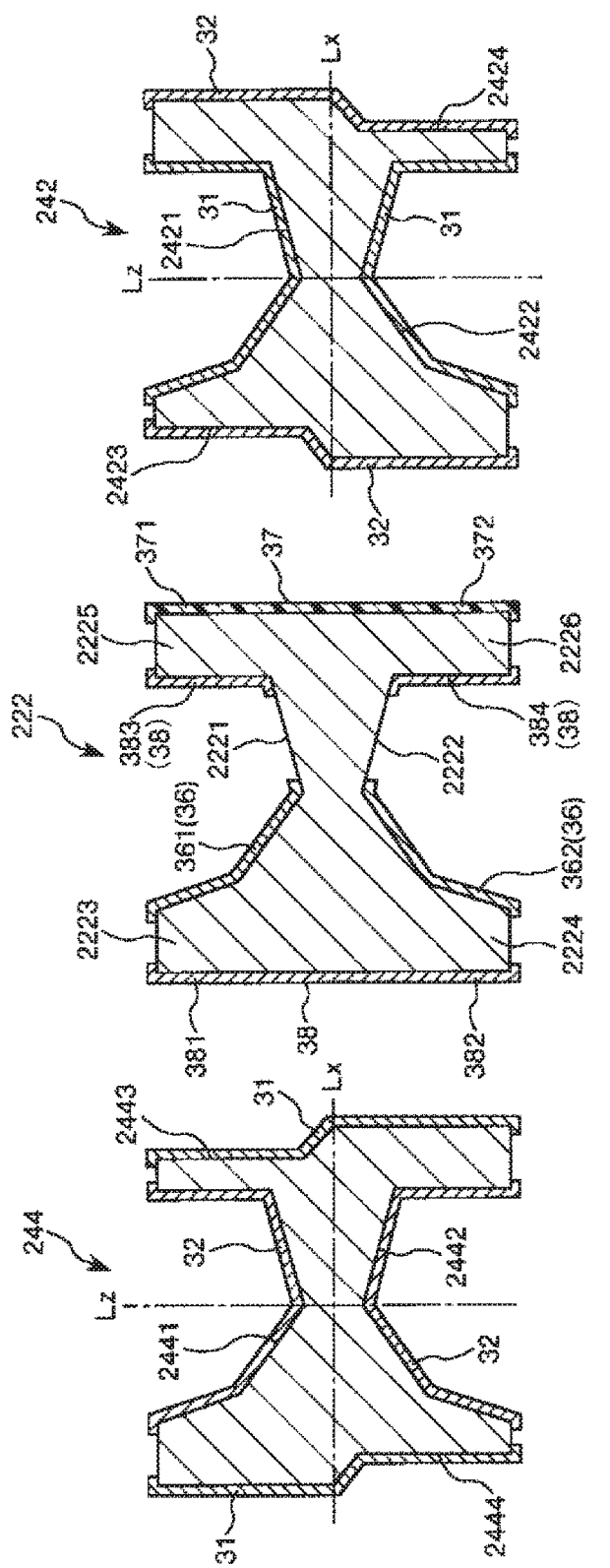
FIG. 3 is a sectional view along line B-B in FIG. 1.
Figure 6:
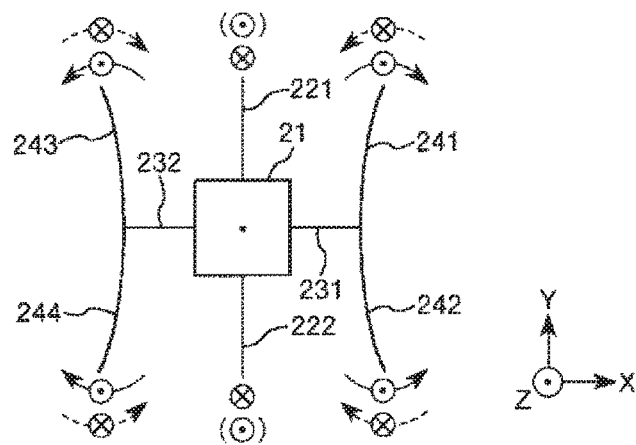
FIG. 6 is a schematic diagram showing a drive vibration mode of the physical quantity detection vibrator element.
Figure 7:
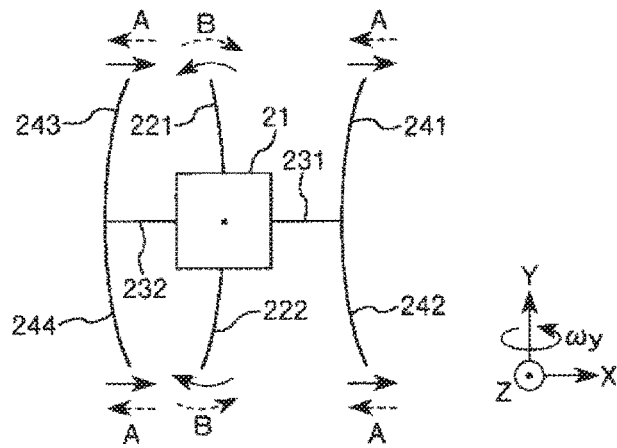
FIG. 7 is a schematic diagram showing a Y-axis detection vibration mode of the physical quantity detection vibrator element.
Figure 8:
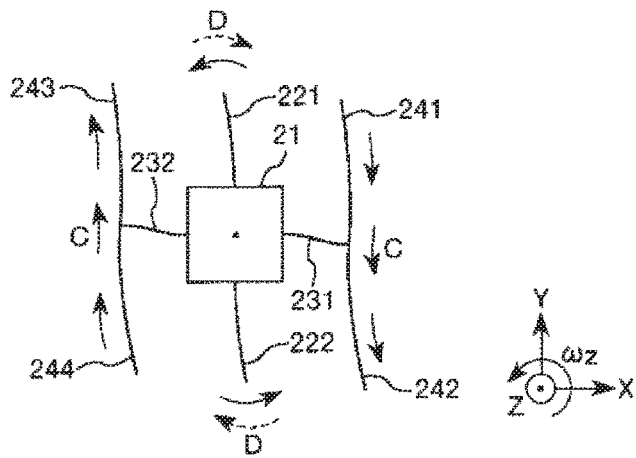
FIG. 8 is a schematic diagram showing a Z-axis detection vibration mode of the physical quantity detection vibrator element.

FIG. 1 is a perspective view of a physical quantity detection vibrator element according to the first embodiment of the invention. FIG. 2 is a sectional view along line A-A in FIG. 1. FIG. 3 is a sectional view along line B-B in FIG. 1. FIGS. 4 and 5 are respectively sectional views showing directions of electric fields generated in detection arms by flexural vibrations. FIG. 6 is a schematic diagram showing a drive vibration mode of the physical quantity detection vibrator element. FIG. 7 is a schematic diagram showing a Y-axis detection vibration mode of the physical quantity detection vibrator element. FIG. 8 is a schematic diagram showing a Z-axis detection vibration mode of the physical quantity detection vibrator element. Note that, for convenience of explanation, in the sectional views of FIGS. 2 and 3, illustration of beam portions is omitted.

Hereinafter, for convenience of explanation, crystal axes of quartz crystal are referred to as an X-axis (electrical axis), a Y-axis (mechanical axis), and a Z-axis (optical axis), and directions along the X-axis are also referred to as "X-axis directions (second directions)", directions along the Y-axis are also referred to as "Y-axis directions (third directions)", and directions along the Z-axis are also referred to as "Z-axis directions (first directions)". Further, the +Z-axis side is also referred to as "upper" and the −Z-axis side is also referred to as "lower".

A vibrator element 1 shown in FIG. 1 is a physical quantity detection vibrator element that may independently detect an angular velocity ωz about the Z-axis and an angular velocity ωy about the Y-axis. The vibrator element 1 has a vibrator 2 and electrodes provided on the vibrator 2.

The vibrator 2 is formed using quartz crystal. The constituent material of the vibrator 2 is not limited to quartz crystal, but may be another piezoelectric material than quartz crystal e.g. lithium tantalate, lithium niobate, lithium borate, barium titanate, or the like may be used. Further, the vibrator 2 is a plate shape having a breadth in the XY-plane defined by the X-axis and the Y-axis as the crystal axes of the quartz crystal and having a thickness in the Z-axis directions. In other words, the vibrator 2 is formed by patterning of a Z-cut quartz crystal plate. Note that the cut angle of the quartz crystal is not limited to that as long as it may achieve the purpose. For example, the Z-axis may be slightly shifted with respect to the thickness direction of the vibrator 2.

The vibrator 2 has a base part 21 located nearly at the center, detection arms 221 and 222 extending from the base part 21 toward both sides in the Y-axis directions, connecting arms 231 and 232 extending from the base part 21 toward both sides in the X-axis directions, drive arms 241 and 242 extending from the tip end portion of the connecting arm 231 toward both sides in the Y-axis directions, drive arms 243 and 244 extending from the tip end portion of the connecting arm 232 toward both sides in the Y-axis directions, supporting portions 251 and 252 provided separately in the Y-axis directions with the base part 21 in between, beam portions 261 and 262 connecting the base part 21 and the supporting portion 251, and beam portions 263 and 264 connecting the base part 21 and the supporting portion 252. Further, the vibrator is mounted on a separate member such as a package via the supporting portions 251 and 252.

According to the configuration, the arms 221, 222, 241, 242, 243, and 244 may be placed with balance and the vibrator 2 may be vibrated with balance.

As shown in FIG. 2, the detection arm 221 has a groove portion (detection arm first groove portion) 2211 opening in an upper surface (detection arm first principal surface) and extending in the Y-axis directions and a groove portion (detection arm second groove portion) 2212 opening in a lower surface (detection arm second principal surface) and extending in the Y-axis directions. Accordingly, the detection arm 221 has an H-shaped cross section shape. Further, the detection arm 221 has a projection portion (first projection portion) 2213 located between the groove portion 2211 and a side surface on the −X-axis side (detection arm first side surface) and projecting in the +Z-axis direction, a projection portion (second projection portion) 2214 located between the groove portion 2212 and a side surface on the −X-axis side and projecting in the −Z-axis direction, a projection portion (third projection portion) 2215 located between the groove portion 2211 and a side surface on the +X-axis side (detection arm second side surface) and projecting in the +Z-axis direction, and a projection portion (fourth projection portion) 2216 located between the groove portion 2212 and a side surface on the +X-axis side and projecting in the −Z-axis direction.

As shown in FIG. 3, the detection arm 222 has a groove portion (detection arm first groove portion) 2221 opening in an upper surface (detection arm first principal surface) and extending in the Y-axis directions and a groove portion (detection arm second groove portion) 2222 opening in a lower surface (detection arm second principal surface) and extending in the Y-axis directions. Accordingly, the detection arm 222 has an H-shaped cross section shape. Further, the detection arm 222 has a projection portion (first projection portion) 2223 located between the groove portion 2221 and a side surface on the −X-axis side (detection arm first side surface) and projecting in the +Z-axis direction, a projection portion (second projection portion) 2224 located between the groove portion 2222 and a side surface on the −X-axis side and projecting in the −Z-axis direction, a projection portion (third projection portion) 2225 located between the groove portion 2221 and a side surface on the +X-axis side (detection arm second side surface) and projecting in the +Z-axis direction, and a projection portion (fourth projection portion) 2226 located between the groove portion 2222 and a side surface on the +X-axis side and projecting in the −Z-axis direction.

These detection arms (221 and 222) are provided on both sides with the base part 21 in between and symmetrically placed with respect to an axis Jx passing through the center of gravity of the base part 21 along the X-axis. By the placement, as will be described later, the angular velocity ωy and the angular velocity ωz can be independently detected using differences of combinations of vibration directions of the detection arms (221 and 222).

As shown in FIG. 2, the drive arm 241 has a groove portion (drive arm first groove portion) 2411 opening in an upper surface (drive arm first principal surface) and extending in the Y-axis directions and a groove portion (drive arm second groove portion) 2412 opening in a lower surface (drive arm second principal surface) and extending in the Y-axis directions. Further, the drive arm 241 has a stepped portion 2413 located on the −X-axis side of the groove portion 2411 and connecting the upper surface and a side surface on the −X-axis side (drive arm first side surface) and a stepped portion 2414 located on the +X-axis side of the groove portion 2412 and connecting the lower surface and a side surface on the +X-axis side (drive arm second side surface).

As shown in FIG. 3, the drive arm 242 has a groove portion (drive arm first groove portion) 2421 opening in an upper surface (drive arm first principal surface) and extending in the Y-axis directions and a groove portion (drive arm second groove portion) 2422 opening in a lower surface (drive arm second principal surface) and extending in the Y-axis directions. Further, the drive arm 242 has a stepped portion 2423 located on the −X-axis side of the groove portion 2421 and connecting the upper surface and a side surface on the −X-axis side (drive arm first side surface) and a stepped portion 2424 located on the +X-axis side of the groove portion 2422 and connecting the lower surface and a side surface on the +X-axis side (drive arm second side surface).

As shown in FIG. 2, the drive arm 243 has a groove portion (drive arm first groove portion) 2431 opening in an upper surface (drive arm first principal surface) and extending in the Y-axis directions and a groove portion (drive arm second groove portion) 2432 opening in a lower surface (drive arm second principal surface) and extending in the Y-axis directions. Further, the drive arm 243 has a stepped portion 2433 located on the +X-axis side of the groove portion 2431 and connecting the upper surface and a side surface on the +X-axis side (drive arm first side surface) and a stepped portion 2434 located on the −X-axis side of the groove portion 2432 and connecting the lower surface and a side surface on the −X-axis side (drive arm second side surface).

As shown in FIG. 3, the drive arm 244 has a groove portion (drive arm first groove portion) 2441 opening in an upper surface (drive arm first principal surface) and extending in the Y-axis directions and a groove portion (drive arm second groove portion) 2442 opening in a lower surface (drive arm second principal surface) and extending in the Y-axis directions. Further, the drive arm 244 has a stepped portion 2443 located on the +X-axis side of the groove portion 2441 and connecting the upper surface and a side surface on the +X-axis side (drive arm first side surface) and a stepped portion 2444 located on the −X-axis side of the groove portion 2442 and connecting the lower surface and a side surface on the −X-axis side (drive arm second side surface).

Of these drive arms 241 to 244, the drive arms 241 and 243 and the drive arms 242 and 244 are symmetrically placed with respect to the axis Jx, and the drive arms 241 and 242 and the drive arms 243 and 244 are symmetrically placed with respect to an axis Jy passing through the center of gravity along the Y-axis. Further, the drive arms 241 to 244 have asymmetric cross-section shapes with respect to both lines of center lines Lx of the arms in the X-axis directions and center lines Lz of the arms in the Z-axis directions. By virtue of their shapes, as will be described later, in a drive vibration mode, the drive arms 241 to 244 may be vibrated in oblique directions including the X-axis components and the Z-axis components.

The beam portion 261 passes between the detection arm 221 and the drive arm 241, and connects to the base part 21 and the supporting portion 251. The beam portion 262 passes between the detection arm 221 and the drive arm 243, and connects to the base part 21 and the supporting portion 251. Further, the beam portion 263 passes between the detection arm 222 and the drive arm 242, and connects to the base part 21 and the supporting portion 252. The beam portion 264 passes between the detection arm 222 and the drive arm 244, and connects to the base part 21 and the supporting portion 252.

Next, the electrodes provided on the vibrator 2 are explained. As shown in FIGS. 1 to 3, the electrodes provided on the vibrator 2 include drive signal electrodes 31, drive ground electrodes 32, first detection signal electrodes 33, a second detection signal electrode 34, first detection ground electrodes 35, third detection signal electrodes 36, a fourth detection signal electrode 37, and second detection ground electrodes 38.

The drive signal electrodes 31 are provided on the upper surface and the lower surface (within the groove portions 2411 and 2412) of the drive arm 241, the upper surface and the lower surface (within the groove portions 2421 and 2422) of the drive arm 242, both side surfaces of the drive arm 243, and both side surfaces of the drive arm 244. Further, the drive signal electrodes 31 pass through the beam portion 264 and are electrically connected to a drive signal terminal 41 provided in the supporting portion 252. The drive signal electrodes 31 are electrodes for applying drive signals (voltages) for drive vibrations of the drive arms 241 to 244.

The drive ground electrodes 32 are provided on both side surfaces of the drive arm 241, both side surfaces of the drive arm 242, the upper surface and the lower surface (within the groove portions 2431 and 2432) of the drive arm 243, and the upper surface and the lower surface (within the groove portions 2441 and 2442) of the drive arm 244. Further, the drive ground electrodes 32 pass through the beam portion 262 and are electrically connected to a drive ground terminal 42 provided in the supporting portion 251. The drive ground electrodes 32 are electrodes at the ground (reference potential) with respect to the drive signal electrodes 31.

The first detection signal electrodes 33 are provided on a side surface on the −X-axis side of the groove portion 2211 of the detection arm 221 and a side surface on the −X-axis side of the groove portion 2212. Further, the first detection signal electrodes 33 pass through the beam portion 261 and are electrically connected to a first detection signal terminal 43 provided in the supporting portion 251. The first detection signal electrodes 33 are electrodes for acquiring first detection signals S1 based on the Coriolis force generated when an angular velocity is applied thereto. Note that, hereinafter, the first detection signal electrode 33 provided in the groove portion 2211 is also referred to as "first electrode portion 331" and the first detection signal electrode 33 provided in the groove portion 2212 is also referred to as "second electrode portion 332".

The second detection signal electrode 34 is provided on a side surface on the +X-axis side of the detection arm 221. Further, the second detection signal electrode 34 passes through the beam portion 261 and is electrically connected to a second detection signal terminal 44 provided in the supporting portion 251. The second detection signal electrode 34 is an electrode for acquiring a second detection signal S2 based on the Coriolis force generated when angular velocity is applied thereto. Note that, hereinafter, the portion of the second detection signal electrode 34 provided in the upper part on the side surface (third projection portion 2215) is also referred to as "third electrode portion 341" and the portion provided in the lower part on the side surface (fourth projection portion 2216) is also referred to as "fourth electrode portion 342". In the embodiment, these electrode portions (341 and 342) are integrally formed. However, these electrode portions (341 and 342) may also be divided (formed separately).

The first detection ground electrodes 35 are provided on a side surface on the −X-axis side of the detection arm 221, a side surface on the +X-axis side of the groove portion 2211, and a side surface on the +X-axis side of the groove portion 2212. Further, the first detection ground electrodes 35 pass through the beam portion 262 and are electrically connected to a first detection ground terminal 45 provided in the supporting portion 251. The first detection ground electrodes 35 are electrodes at the ground (reference potential) with respect to the first and second detection signal electrodes 33 and 34. Note that, hereinafter, the portion of the first detection ground electrode 35 provided in the upper part on the side surface (first projection portion 2213) is also referred to as "first ground electrode portion (first reference potential electrode portion) 351", the portion provided in the lower part on the side surface (second projection portion 2214) is also referred to as "second ground electrode portion (second reference potential electrode portion) 352", the portion provided in the groove portion 2211 is also referred to as "third ground electrode portion (third reference potential electrode portion) 353", and the portion provided in the groove portion 2212 is also referred to as "fourth ground electrode portion (fourth reference potential electrode portion) 354".

As above, the first and second detection signal electrodes 33 and 34 and the first detection ground electrodes 35 provided on the detection arm 221 are explained. The arrangement of these electrodes is summarized as follows: the first electrode portion 331 and the first ground electrode portion 351 are provided to face each other with the first projection portion 2213 in between; the second electrode portion 332 and the second ground electrode portion 352 are provided to face each other with the second projection portion 2214 in between; the third electrode portion 341 and the third ground electrode portion 353 are provided to face each other with the third projection portion 2215 in between; and the fourth electrode portion 342 and the fourth ground electrode portion 354 are provided to face each other with the fourth projection portion 2216 in between. By the arrangement, the electric field efficiency is improved and the larger signals (voltages) may be extracted from the first detection signal electrodes 33 and the second detection signal electrode 34.

Note that, as shown in FIG. 4, when the detection arm 221 flexurally vibrates in the Z-axis directions (directions of an arrow a), a signal (electric field) Sz1 generated between the first electrode portion 331 and the first ground electrode portion 351 and a signal (electric field) Sz2 generated between the second electrode portion 332 and the second ground electrode portion 352 are in opposite phase and a signal (electric field) Sz3 generated between the third electrode portion 341 and the third ground electrode portion 353 and a signal (electric field) Sz4 generated between the fourth electrode portion 342 and the fourth ground electrode portion 354 are in opposite phase. On the other hand, when the detection arm 221 flexurally vibrates in the X-axis directions (directions of an arrow b), a signal Sx1 generated between the first electrode portion 331 and the first ground electrode portion 351 and a signal Sx2 generated between the second electrode portion 332 and the second ground electrode portion 352 are in phase and a signal Sx3 generated between the third electrode portion 341 and the third ground electrode portion 353 and a signal Sx4 generated between the fourth electrode portion 342 and the fourth ground electrode portion 354 are in phase.

The third detection signal electrodes 36 are provided on a side surface on the −X-axis side of the groove portion 2221 of the detection arm 222 and a side surface on the −X-axis side of the groove portion 2222. Further, the third detection signal electrodes 36 pass through the beam portion 263 and are electrically connected to a third detection signal terminal 46 provided in the supporting portion 252. The third detection signal electrodes 36 are electrodes for acquiring third detection signals S3 based on the Coriolis force generated when the angular velocity is applied thereto. Note that, hereinafter, the third detection signal electrodes 36 provided in the groove portion 2221 are also referred to as "first electrode portions 361" and the third detection signal electrodes 36 provided in the groove portion 2222 are also referred to as "second electrode portions 362".

The fourth detection signal electrode 37 is provided on a side surface on the +X-axis side of the detection arm 222. Further, the fourth detection signal electrode 37 passes through the beam portion 263 and is electrically connected to a fourth detection signal terminal 47 provided in the supporting portion 252. The fourth detection signal electrode 37 is an electrode for acquiring a fourth detection signal S4 based on the Coriolis force generated when the angular velocity is applied thereto. Note that, hereinafter, the portion of the fourth detection signal electrode 37 provided in the upper part on the side surface (third projection portion 2225) is also referred to as "third electrode portion 371" and the portion provided in the lower part on the side surface (fourth projection portion 2226) is also referred to as "fourth electrode portion 372". In the embodiment, these electrode portions (371 and 372) are integrally formed. However, these electrode portions (371 and 372) may also be divided (separately formed).

The second detection ground electrodes 38 are provided on a side surface on the −X-axis side of the detection arm 222, a side surface on the +X-axis side of the groove portion 2221, and a side surface on the +X-axis side of the groove portion 2222. Further, the second detection ground electrodes 38 pass through the beam portion 264 and are electrically connected to a second detection ground terminal 48 provided in the supporting portion 252. The second detection ground electrodes 38 are electrodes at the ground (reference potential) with respect to the third and fourth detection signal electrodes 36 and 37. Note that, hereinafter, the portion of the second detection ground electrode 38 provided in the upper part on the side surface (first projection portion 2223) is also referred to as "first ground electrode portion (first reference potential electrode portion) 381", the portion provided in the lower part on the side surface (second projection portion 2224) is also referred to as "second ground electrode portion (second reference potential electrode portion) 382", the portion provided in the groove portion 2221 is also referred to as "third ground electrode portion (third reference potential electrode portion) 383", and the portion provided in the groove portion 2222 is also referred to as "fourth ground electrode portion (fourth reference potential electrode portion) 384".

As above, the third and fourth detection signal electrodes 36 and 37 and the second detection ground electrodes provided on the detection arm 222 are explained. The arrangement of these electrodes is summarized as follows: the first electrode portion 361 and the first ground electrode portion 381 are provided to face each other with the first projection portion 2223 in between; the second electrode portion 362 and the second ground electrode portion 382 are provided to face each other with the second projection portion 2224 in between; the third electrode portion 371 and the third ground electrode portion 383 are provided to face each other with the third projection portion 2225 in between; and the fourth electrode portion 372 and the fourth ground electrode portion 384 are provided to face each other with the fourth projection portion 2226 in between. By the arrangement, the electric field efficiency is improved and the larger signals (voltages) may be extracted from the third detection signal electrodes 36 and the fourth detection signal electrode 37.

Note that, as shown in FIG. 5, when the detection arm 222 flexurally vibrates in the Z-axis directions, a signal Sz1 generated between the first electrode portion 361 and the first ground electrode portion 381 and a signal Sz2 generated between the second electrode portion 362 and the second ground electrode portion 382 are in opposite phase and a signal Sz3 generated between the third electrode portion 371 and the third ground electrode portion 383 and a signal Sz4 generated between the fourth electrode portion 372 and the fourth ground electrode portion 384 are in opposite phase. On the other hand, when the detection arm 222 flexurally vibrates in the X-axis directions, a signal Sx1 generated between the first electrode portion 361 and the first ground electrode portion 381 and a signal Sx2 generated between the second electrode portion 362 and the second ground electrode portion 382 are in phase and a signal Sx3 generated between the third electrode portion 371 and the third ground electrode portion 383 and a signal Sx4 generated between the fourth electrode portion 372 and the fourth ground electrode portion 384 are in phase.

As above, the configuration of the vibrator element 1 is explained in detail. The vibrator element 1 may detect the angular velocity ωy about the Y-axis and the angular velocity ωz about the Z-axis in the following manner.

First, when drive signals are applied between the drive signal electrodes 31 and the drive ground electrodes 32, the drive arms 241 to 244 vibrate in a drive vibration mode as shown in FIG. 6. Specifically, the drive arms 241 to 244 respectively obliquely vibrate including the X-axis direction components and the Z-axis direction components. This is because, when the drive signals are applied, the drive arms 241 to 244 respectively tend to flexurally vibrate in the X-axis directions due to the inverse piezoelectric effect, however, the vibration components in the Z-axis directions are generated due to the above described cross-sectional shapes of the drive arms 241 to 244 (asymmetric shapes with respect to the center lines Lx and Lz) and, as a result, the drive arms vibrate in the oblique directions including the X-axis direction components and the Z-axis direction components.

In the drive vibration mode, the drive arms 241 and 242 and the drive arms 243 and 244 perform flexural vibrations plane-symmetrically with respect to the YZ-plane passing the center of gravity, and thus, the vibrations of the drive arms 241 to 244 in the X-axis directions are cancelled out. Accordingly, the detection arms 221 and 222 rarely vibrate in the X-axis directions. On the other hand, the drive arms 241 to 244 vibrate toward the same side in the Z-axis directions with each other, and thus, the vibrations of the drive arms 241 to 244 in the Z-axis directions are not cancelled out. Accordingly, the detection arms 221 and 222 flexurally vibrate in the Z-axis directions in opposite phase to the drive arms 241 to 244 to achieve a balance with the drive arms 241 to 244.

In the state of driving in the drive vibration mode, when the angular velocity ωy about the Y-axis is applied to the vibrator element 1, a Y-axis detection vibration mode as shown in FIG. 7 is newly excited. In the Y-axis detection vibration mode, the Coriolis force acts on the drive arms 241 to 244 and the vibrations in the directions shown by arrows A are excited and the detection arms 221 and 222 flexurally vibrate in the directions shown by arrows B (in the X-axis directions) in response to the vibrations. The electric charge generated in the detection arms 221 and 222 by the vibrations is extracted from the detection signal electrodes 33, 34, 36, and 37 as detection signals S1, S2, S3, and S4, and the angular velocity ωy may be detected based on the signals.

On the other hand, in the state of driving in the drive vibration mode, when the angular velocity ωz about the Z-axis is applied to the vibrator element 1, a Z-axis detection vibration mode as shown in FIG. 8 is newly excited. In the Z-axis detection vibration mode, the Coriolis force acts on the drive arms 241 to 244 and the vibrations in the directions shown by arrows C are excited and the detection arms 221 and 222 flexurally vibrate in the directions shown by arrows D (in the X-axis directions) in response to the vibrations. The electric charge generated in the detection arms 221 and 222 by the vibrations is extracted from the detection signal electrodes 33, 34, 36, and 37 as detection signals S1, S2, S3, and S4, and the angular velocity ωz may be detected based on the signals.

Here, when the angular velocity ωy is applied, as shown in FIG. 7, the detection arms 221 and 222 flexurally vibrate in the X-axis directions in phase. On the other hand, when the angular velocity ωz is applied, as shown in FIG. 8, the detection arms 221 and 222 flexurally vibrate in the X-axis directions in opposite phase. The vibrator element 1 may respectively independently detect the angular velocity ωy and the angular velocity ωz using differences of combinations of the vibration directions of the detection arms 221 and 222. As below, this will be explained in detail.

When the angular velocity ωy is applied to the vibrator element 1, as described above, the detection arms 221 and 222 flexurally vibrate in the X-axis directions in phase. As shown in FIGS. 4 and 5, the generated second detection signal S2 and the first detection signal S1 are in opposite phase, the third detection signal S3 and the first detection signal S1 are in phase, and the fourth detection signal S4 and the first detection signal S1 are in opposite phase. Accordingly, assuming that the detection signals S1 to S4 have equal intensity, one may let the first detection signal S1 generated by application of the angular velocity ωy be +Sy, the second detection signal S2 be −Sy, the third detection signal S3 be +Sy, and the fourth detection signal S4 be −Sy.

On the other hand, when the angular velocity ωz is applied to the vibrator element 1, as described above, the detection arms 221 and 222 flexurally vibrate in the X-axis directions in opposite phase. The generated second detection signal S2 and the first detection signal S1 are in opposite phase, the third detection signal S3 and the first detection signal S1 are in opposite phase, and the fourth detection signal S4 and the first detection signal S1 are in phase. Accordingly, assuming that the detection signals S1 to S4 have equal intensity, one may let the first detection signal S1 generated by application of the angular velocity ωz be +Sz, the second detection signal S2 be −Sz, the third detection signal S3 be −Sz, and the fourth detection signal S4 be +Sz.

Therefore, one may let the first detection signal S1 generated by application of the angular velocity ωyz about an axis having components in both directions of the Y-axis directions and the Z-axis directions (i.e., an axis inclined with respect to both axes of the Y-axis and the Z-axis) be +Sy+Sz, the second detection signal S2 be −Sy−Sz, the third detection signal S3 be +Sy−Sz, and the fourth detection signal S4 be −Sy+Sz.

Addition and subtraction are performed among these detection signals S1, S2, S3, and S4, and thereby, the angular velocity ωy and the angular velocity ωz may be separated from the angular velocity ωyz, and the angular velocity ωy and the angular velocity ωz may be independently detected.

Specifically, regarding the detection arm 221, calculation of (S1−S2) is performed, and thereby, (+Sy+Sz)−(−Sy−Sz)=2(Sy+Sz) and the detection signal obtained from the detection arm 221 is doubled. Similarly, regarding the detection arm 222, calculation of (S3−S4) is performed, and thereby, (+Sy−Sz)−(−Sy+Sz)=2(Sy−Sz) and the detection signal obtained from the detection arm 222 is doubled.

Then, calculation of (S1−S2)+(S3−S4) is performed, and thereby, 2(Sy+Sz)+2(Sy−Sz)=4Sy, and the signal Sy derived from the angular velocity ωy may be separated. Thereby, the angular velocity ωy is obtained. On the other hand, calculation of (S1−S2)−(S3−S4) renders 2(Sy+Sz)−2(Sy−Sz)=4Sz, and the signal Sz derived from the angular velocity ωz may be separated. Thereby, the angular velocity ωz is obtained. In this manner, according to the vibrator element 1, the angular velocity ωy and the angular velocity ωz may be respectively independently detected. Particularly, the signal obtained from the detection arm 221 is doubled using the first and second detection signals S1, S2, and the signal obtained from the detection arm 222 is doubled using the third and fourth detection signals S3, S4. Thus, the detection sensitivity of the angular velocity ωy and the angular velocity ωz is improved.

According to the vibrator element 1, in addition to the above described effects, the following effect may be exerted. In the vibrator element 1, the drive signal electrodes 31 (conductors to which drive signals are applied including the drive signal terminal 41, wires, etc.) are provided close to the detection signal electrodes 33, 34, 36, and 37, and noise due to the drive signals is mixed in the detection signals S1, S2, S3, and S4 because of electrostatic coupling of the drive signal electrodes 31 and the detection signal electrodes 33, 34, 36, and 37. This noise may cause degradation of the detection sensitivity. However, according to the vibrator element 1, the noise mixed in the detection signals S1, S2, S3, and S4 may be sufficiently cancelled (reduced) and the angular velocities may be accurately detected.

As below, the case where a capacitance C1 between the drive signal electrode 31 and the first detection signal electrode 33 is set (i.e., assumed to be) to 1.7 fF, a capacitance C2 between the drive signal electrode 31 and the second detection signal electrode 34 is set to 0.9 fF, a capacitance C3 between the drive signal electrode 31 and the third detection signal electrode 36 is set to 1.8 fF, and a capacitance C4 between the drive signal electrode 31 and the fourth detection signal electrode 37 is set to 1.1 fF will be specifically explained as an example. Note that the capacitances C1 to C4 are different from one another because the relative position relationships between the detection signal electrodes 33, 34, 36, and 37 and the drive signal electrodes 31 are different from one another. Specifically, the drive signal electrode 31 is drawn out to the supporting portion 252 via the beam portion 264, and thus, the capacitances C3 and C4 (capacitive coupling) closer to the beam portion 264 are slightly larger than the capacitances C1 and C2 farther from the beam portion 264. Further, for convenience of explanation, the capacitance C1 is regarded (assumed) as being proportional to the noise mixed in the first detection signal S1, the capacitance C2 is regarded as being proportional to the noise mixed in the second detection signal S2, the capacitance C3 is regarded as being proportional to the noise mixed in the third detection signal S3, and the capacitance C4 is regarded as being proportional to the noise mixed in the fourth detection signal S4.

As described above, in the vibrator element 1, the calculation of (S1−S2)+(S3−S4) is performed to obtain the angular velocity ωy. In this regard, the noise is added and subtracted together and the noise contained in the calculation result of (S1−S2)+(S3−S4) is proportional to (1.7−0.9)+(1.8−1.1)=1.5 fF. In this case, the noise on the detection arm 221 side and the noise on the detection arm 222 side are added. However, the noise is partially cancelled out within the detection arm 221 and the noise is also partially cancelled out within the detection arm 222, and thereby, the noise increase as a whole is suppressed. Accordingly, the angular velocity ωy can be detected more accurately.

Further, as described above, in the vibrator element 1, the calculation of (S1−S2)−(S3−S4) is performed to obtain the angular velocity ωz. In this regard, the noise is added and subtracted together and the noise contained in the calculation result of (S1−S2)−(S3−S4) is proportional to (1.7−0.9)−(1.8−1.1)=0.1 fF. In this case, the noise is partially cancelled out within the detection arm 221, the noise is also partially cancelled out within the detection arm 222, and the remaining noise is cancelled out. Thereby, the noise as a whole is suppressed to be sufficiently low. Accordingly, the angular velocity ωz can be detected more accurately.

In this manner, according to the vibrator, the noise may be effectively reduced and both the angular velocity ωy and the angular velocity ωz may be detected with higher sensitivity.

Further, according to the vibrator element 1, the leakage signals (output) from the detection arms 221, 222 in the drive vibration mode may be reduced. Accordingly, false detection of the angular velocity ωy and the angular velocity ωz may be reduced.

Specifically, as described above, the detection arms 221 and 222 vibrate in the Z-axis directions even in the drive vibration mode, and (even when the angular velocities are not applied) electric charge is generated in the detection arms 221 and 222. However, as shown in FIG. 4, the signal obtained from the first electrode portion 331 and the signal obtained from the second electrode portion 332 are in opposite phase and the leakage signal is cancelled within the first detection signal electrode 33, and the signal obtained from the third electrode portion 341 and the signal obtained from the fourth electrode portion 342 are in opposite phase and the leakage signal is cancelled within the second detection signal electrode 34. Accordingly, the leakage signal from the detection arm 221 may be reduced. Similarly, as shown in FIG. 5, the signal obtained from the first electrode portion 361 and the signal obtained from the second electrode portion 362 are in opposite phase and the leakage signal is cancelled within the third detection signal electrode 36, and the signal obtained from the third electrode portion 371 and the signal obtained from the fourth electrode portion 372 are in opposite phase and the leakage signal is cancelled within the fourth detection signal electrode 37. Accordingly, the leakage signal from the detection arm 222 may be reduced.

Second Embodiment

Figure 9:
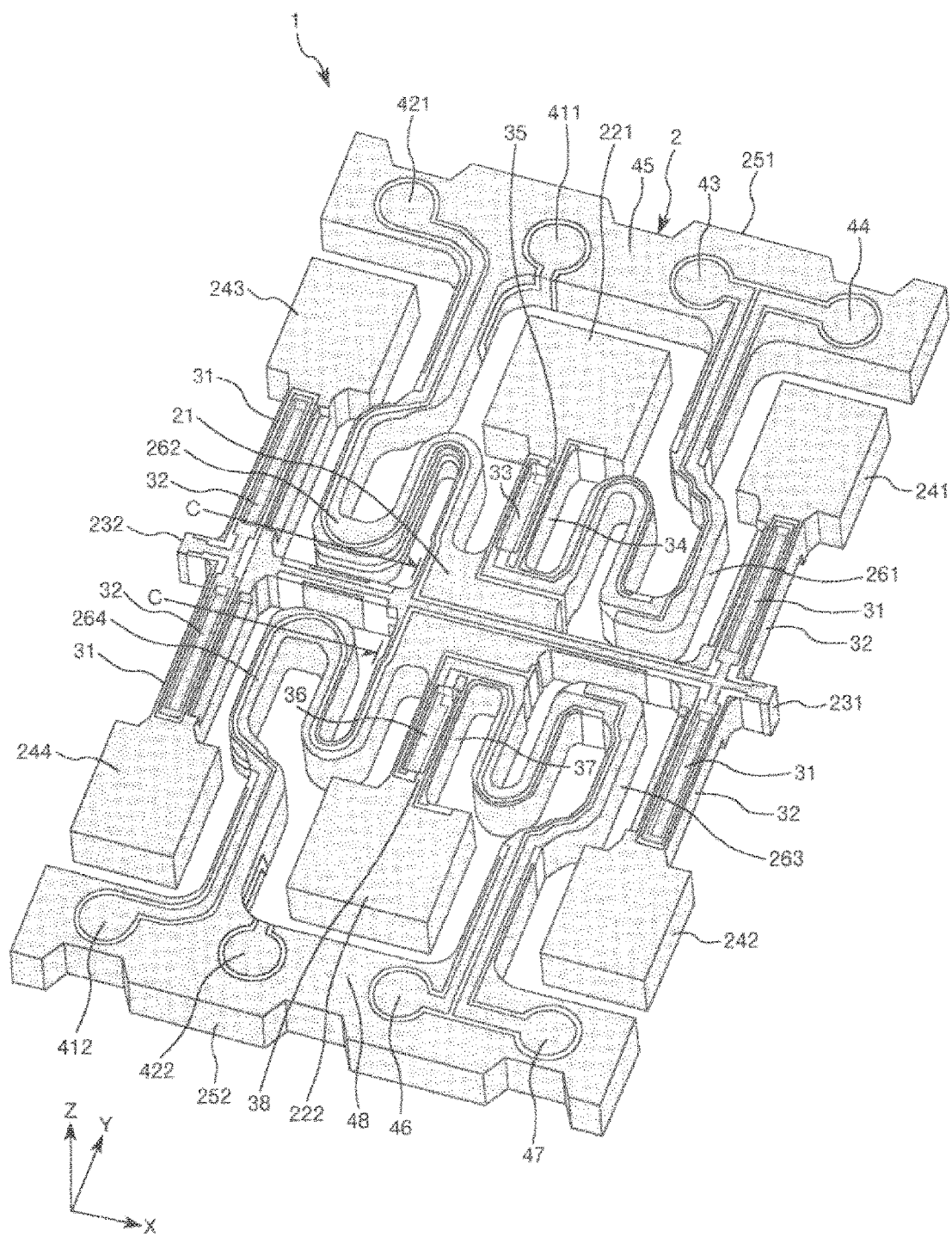
FIG. 9 is a perspective view of a physical quantity detection vibrator element according to a second embodiment of the invention.
Figure 10:
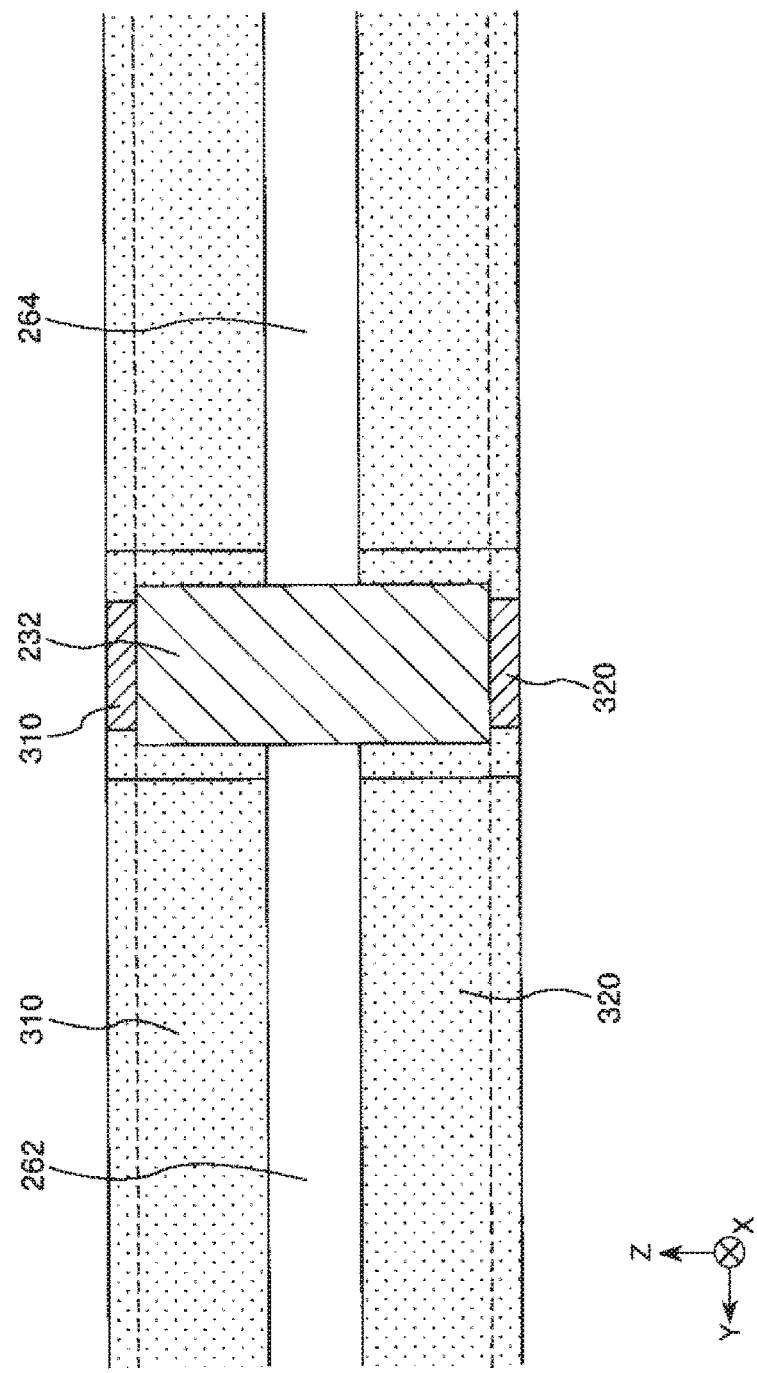
FIG. 10 is a sectional view along line C-C in FIG. 9.

FIG. 9 is a perspective view of a physical quantity detection vibrator element according to a second embodiment of the invention. FIG. 10 is a sectional view along line C-C in FIG. 9.

As below, the physical quantity detection vibrator element of the second embodiment will be explained with a focus on the differences from the above described embodiment and the explanation of the same items will be omitted.

The physical quantity detection vibrator element of the second embodiment is the same as the physical quantity detection vibrator element of the above described first embodiment mainly except that drawing out of the electrodes is different. Note that, in FIGS. 9 and 10, the same configurations (elements) as those of the above described embodiment have the same signs (similar reference characters and are described above).

In the vibrator element 1 of the embodiment, as shown in FIG. 9, the drive signal electrodes 31 pass through the beam portion 262 and are electrically connected to a drive signal terminal 411 provided in the supporting portion 251 and pass through the beam portion 264 and are electrically connected to a drive signal terminal 412 provided in the supporting portion 252. On the other hand, the drive ground electrodes 32 pass through the beam portion 262 and are electrically connected to a drive ground terminal 421 provided in the supporting portion 251 and pass through the beam portion 264 and are electrically connected to a drive ground terminal 422 provided in the supporting portion 252. Further, as shown in FIG. 10, in the beam portions 262, 264, a wire 310 of the drive signal electrode 31 and a wire 320 of the drive ground electrode 32 are routed in division on the upside and the down side of the side surface.

By the arrangement, the wire 310 and the drive signal terminals 411, 412 may be symmetrically placed with respect to the axis Jx. Accordingly, the difference between the capacitance C1 and the capacitance C3 and the difference between the capacitance C2 and the capacitance C4 described in the first embodiment may be eliminated (made closer to zero). Therefore, noise derived from the differences among the capacitances C1 to C4 may be reduced more effectively.

According to the second embodiment, the same effects as those of the above described first embodiment may be exerted.

Third Embodiment

Figure 11:
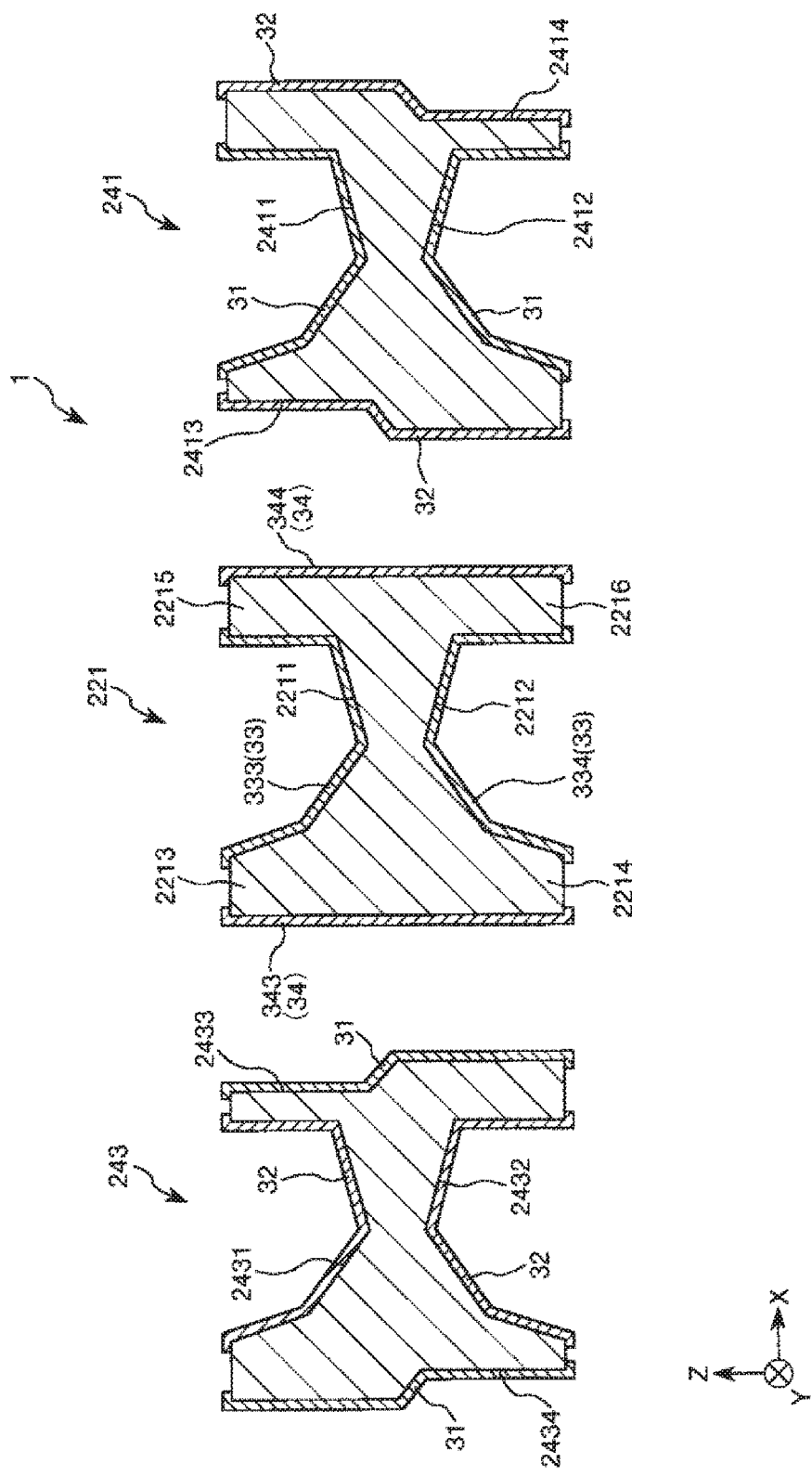
FIG. 11 is a sectional view of a physical quantity detection vibrator element according to a third embodiment of the invention.
Figure 12:
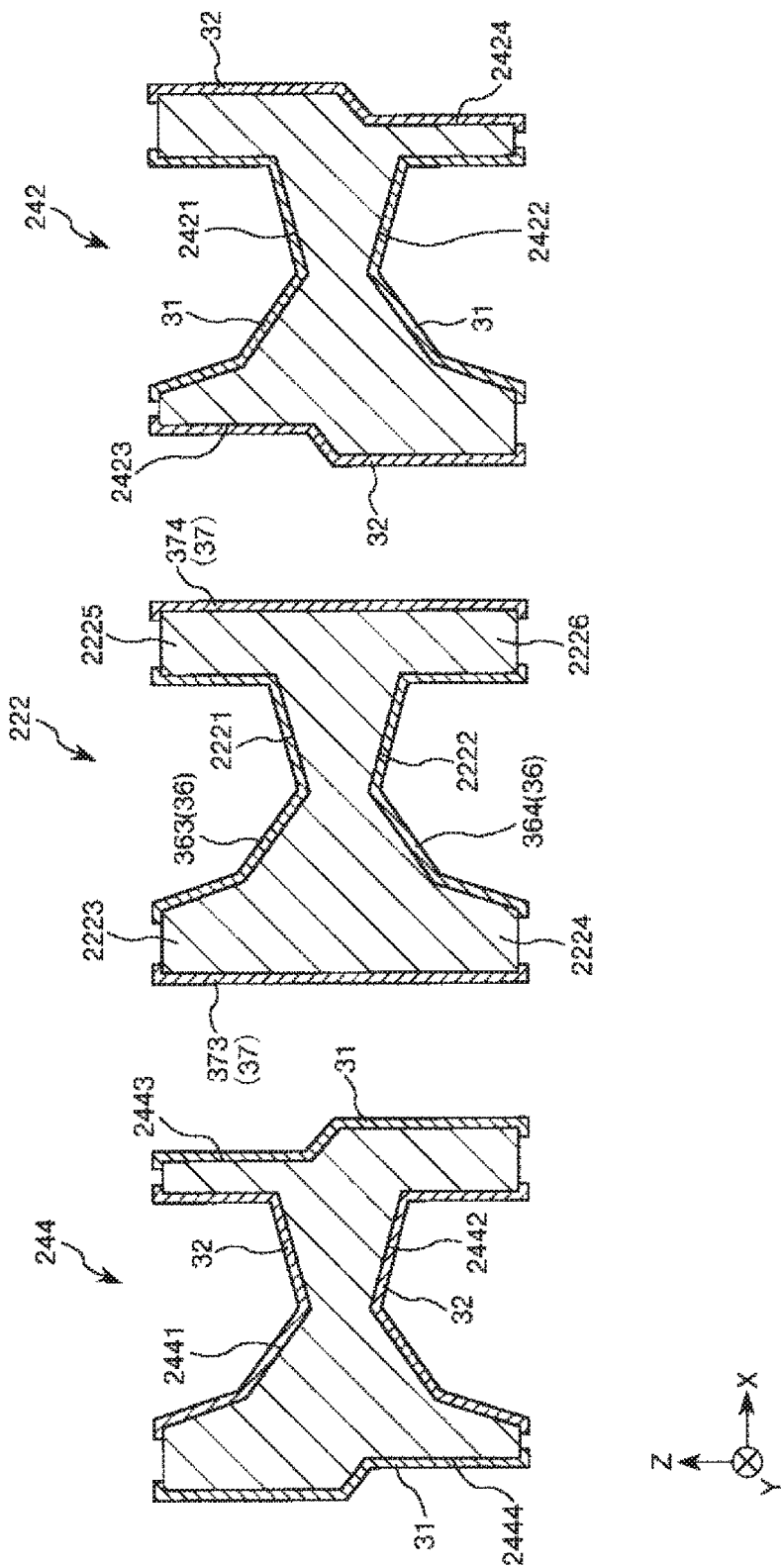
FIG. 12 is a sectional view of the physical quantity detection vibrator element according to the third embodiment of the invention.

FIGS. 11 and 12 are respectively sectional views of a physical quantity detection vibrator element according to the third embodiment of the invention. FIGS. 13 and 14 are respectively sectional views showing directions of electric fields generated in detection arms by flexural vibrations.

As below, the physical quantity detection vibrator element of the third embodiment will be explained with a focus on the differences from the above described embodiments and the explanation of the same items will be omitted.

The physical quantity detection vibrator element of the third embodiment is the same as the physical quantity detection vibrator element of the above described first embodiment mainly except that the configurations of the electrodes are different. Note that, in FIGS. 11 to 14, the same configurations as (elements similar to) those of the above described embodiments have the same signs (reference characters, and are described above). FIG. 11 corresponds to FIG. 2 and FIG. 12 corresponds to FIG. 3.

In the vibrator element 1 of the embodiment, as shown in FIGS. 11 and 12, the electrodes have drive signal electrodes 31, drive ground electrodes 32, first detection signal electrodes 33, second detection signal electrodes 34, third detection signal electrodes 36, and fourth detection signal electrodes 37. In other words, the first and second detection ground electrodes, 35 and 38, are omitted from the above described first embodiment. Note that the arrangement of the drive signal electrodes 31 and the drive ground electrodes 32 are the same as that of the above described first embodiment, and the arrangement of the detection signal electrodes 33, 34, 36, and 37 are explained as below.

The first detection signal electrodes 33 are provided on the inner surfaces of the groove portions 2211 and 2212 of the detection arm 221. On the other hand, the second detection signal electrodes 34 are provided on both side surfaces of the detection arm 221. Note that, hereinafter, for convenience of explanation, the first detection signal electrode 33 provided in the groove portion 2211 is also referred to as "first electrode portion 333" and the first detection signal electrode 33 provided in the groove portion 2212 is also referred to as "second electrode portion 334". Further, the second detection signal electrode 34 provided on the side surface on the −X-side is also referred to as "third electrode portion 343" and the second detection signal electrode 34 provided on the side surface on the +X-side is also referred to as "fourth electrode portion 344".

The arrangement of these electrodes is summarized as follows: the first electrode portion 333 and the third electrode portion 343 are provided (positioned) to face each other with the first projection portion 2213 in between; the second electrode portion 334 and the third electrode portion 343 are provided to face each other with the second projection portion 2214 in between; the first electrode portion 333 and the fourth electrode portion 344 are provided to face each other with the third projection portion 2215 in between; and the second electrode portion 334 and the fourth electrode portion 344 are provided to face each other with the fourth projection portion 2216 in between. By the arrangement, the electric field efficiency is improved and the larger signals (voltages) may be extracted from the first detection signal electrodes 33 and the second detection signal electrodes 34.

Note that, as shown in FIG. 13, when the detection arm 221 flexurally vibrates in the Z-axis directions, a signal Sz1 generated between the first electrode portion 333 and the third electrode portion 343 and a signal Sz2 generated between the second electrode portion 334 and the third electrode portion 343 are in opposite phase and a signal Sz3 generated between the first electrode portion 333 and the fourth electrode portion 344 and a signal Sz4 generated between the second electrode portion 334 and the fourth electrode portion 344 are in opposite phase. On the other hand, when the detection arm 221 flexurally vibrates in the X-axis directions, a signal Sx1 generated between the first electrode portion 333 and the third electrode portion 343 and a signal Sx2 generated between the second electrode portion 334 and the third electrode portion 343 are in phase and a signal Sx3 generated between the first electrode portion 333 and the fourth electrode portion 344 and a signal Sx4 generated between the second electrode portion 334 and the fourth electrode portion 344 are in phase.

The third detection signal electrodes 36 are provided on the inner surfaces of the groove portions 2221 and 2222 of the detection arm 222. On the other hand, the fourth detection signal electrodes 37 are provided on both side surfaces of the detection arm 222. Note that, hereinafter, for convenience of explanation, the third detection signal electrode 36 provided in the groove portion 2221 is also referred to as "first electrode portion 363" and the third detection signal electrode 36 provided in the groove portion 2222 is also referred to as "second electrode portion 364". Further, the fourth detection signal electrode 37 provided on the side surface on the −X-side is also referred to as "third electrode portion 373" and the fourth detection signal electrode 37 provided on the side surface on the +X-side is also referred to as "fourth electrode portion 374".

The arrangement of these electrodes is summarized as follows: the first electrode portion 363 and the third electrode portion 373 are provided to face each other with the first projection portion 2223 in between; the second electrode portion 364 and the third electrode portion 373 are provided to face each other with the second projection portion 2224 in between; the first electrode portion 363 and the fourth electrode portion 374 are provided to face each other with the third projection portion 2225 in between; and the second electrode portion 364 and the fourth electrode portion 374 are provided to face each other with the fourth projection portion 2226 in between. By the arrangement, the electric field efficiency is improved and the larger signals (voltages) may be extracted from the third detection signal electrodes 36 and the fourth detection signal electrodes 37.

Note that, as shown in FIG. 14, when the detection arm 222 flexurally vibrates in the Z-axis directions, a signal Sz1 generated between the first electrode portion 363 and the third electrode portion 373 and a signal Sz2 generated between the second electrode portion 364 and the third electrode portion 373 are in opposite phase and a signal Sz3 generated between the first electrode portion 363 and the fourth electrode portion 374 and a signal Sz4 generated between the second electrode portion 364 and the fourth electrode portion 374 are in opposite phase. On the other hand, when the detection arm 222 flexurally vibrates in the X-axis directions, a signal Sx1 generated between the first electrode portion 363 and the third electrode portion 373 and a signal Sx2 generated between the second electrode portion 364 and the third electrode portion 373 are in phase and a signal Sx3 generated between the first electrode portion 363 and the fourth electrode portion 374 and a signal Sx4 generated between the second electrode portion 364 and the fourth electrode portion 374 are in phase.

According to the configuration, the detection signals S1, S2, S3, and S4 are calculated in the same manner as that of the above described first embodiment, and thereby, the angular velocity ωy and the angular velocity ωz may be independently detected. Further, like the above described first embodiment, the signals obtained from the detection arm 221 by the first and second detection signals S1 and S2 may be doubled and the signals obtained from the detection arm 222 by the third and fourth detection signals S3 and S4 may be doubled. Furthermore, like the above described first embodiment, capacitances (noise) generated between the drive signal electrodes 31 and detection signal electrodes may be cancelled. Moreover, like the above described first embodiment, the leakage signals in the drive vibration mode may be cancelled within the respective detection signal electrodes 33, 34, 36, and 37.

According to the third embodiment, the same effects as those of the above described first embodiment may be exerted.

Fourth Embodiment

Figure 15:
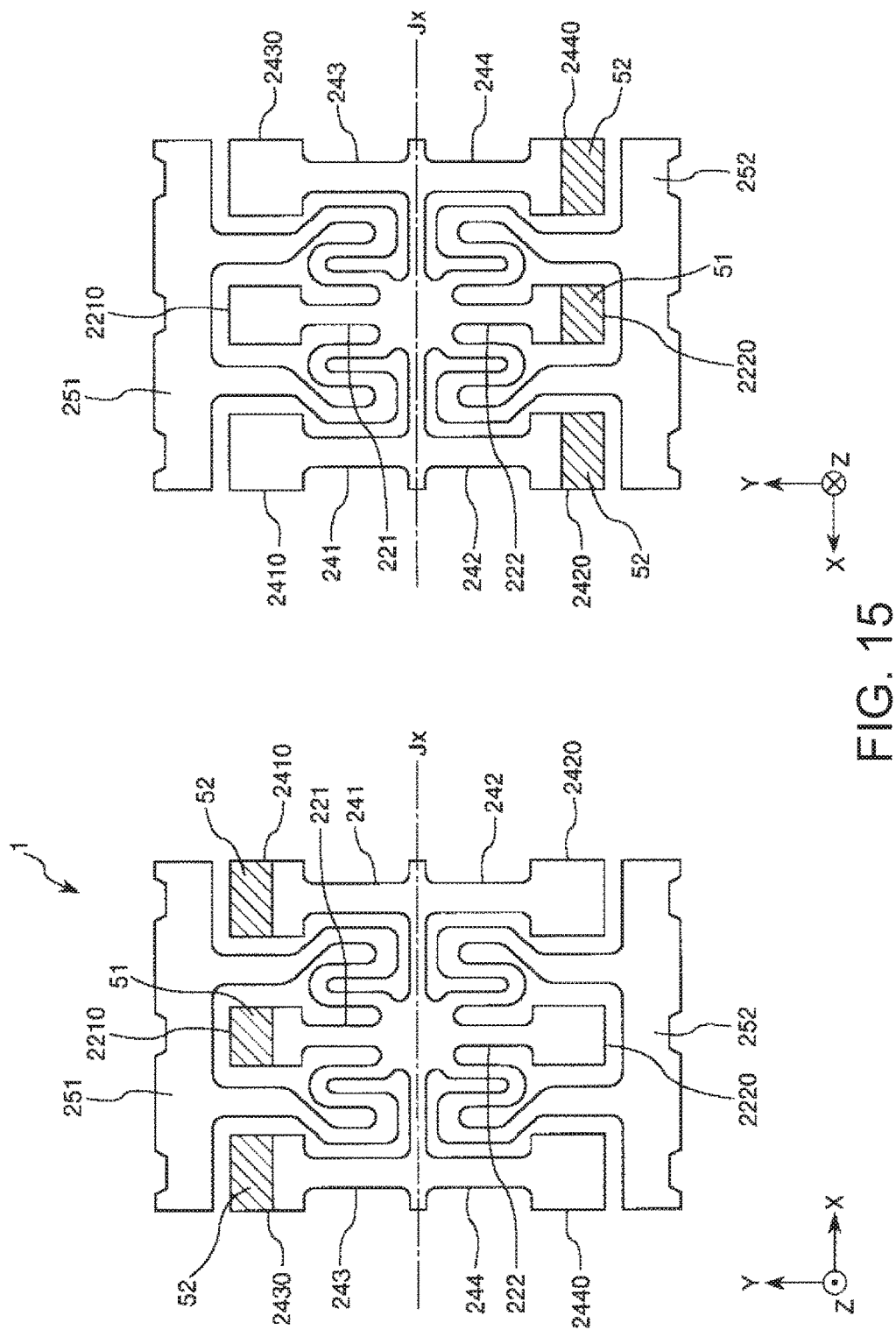
FIG. 15 is a top view and a bottom view of a physical quantity detection vibrator element according to a fourth embodiment of the invention.
Figure 17:
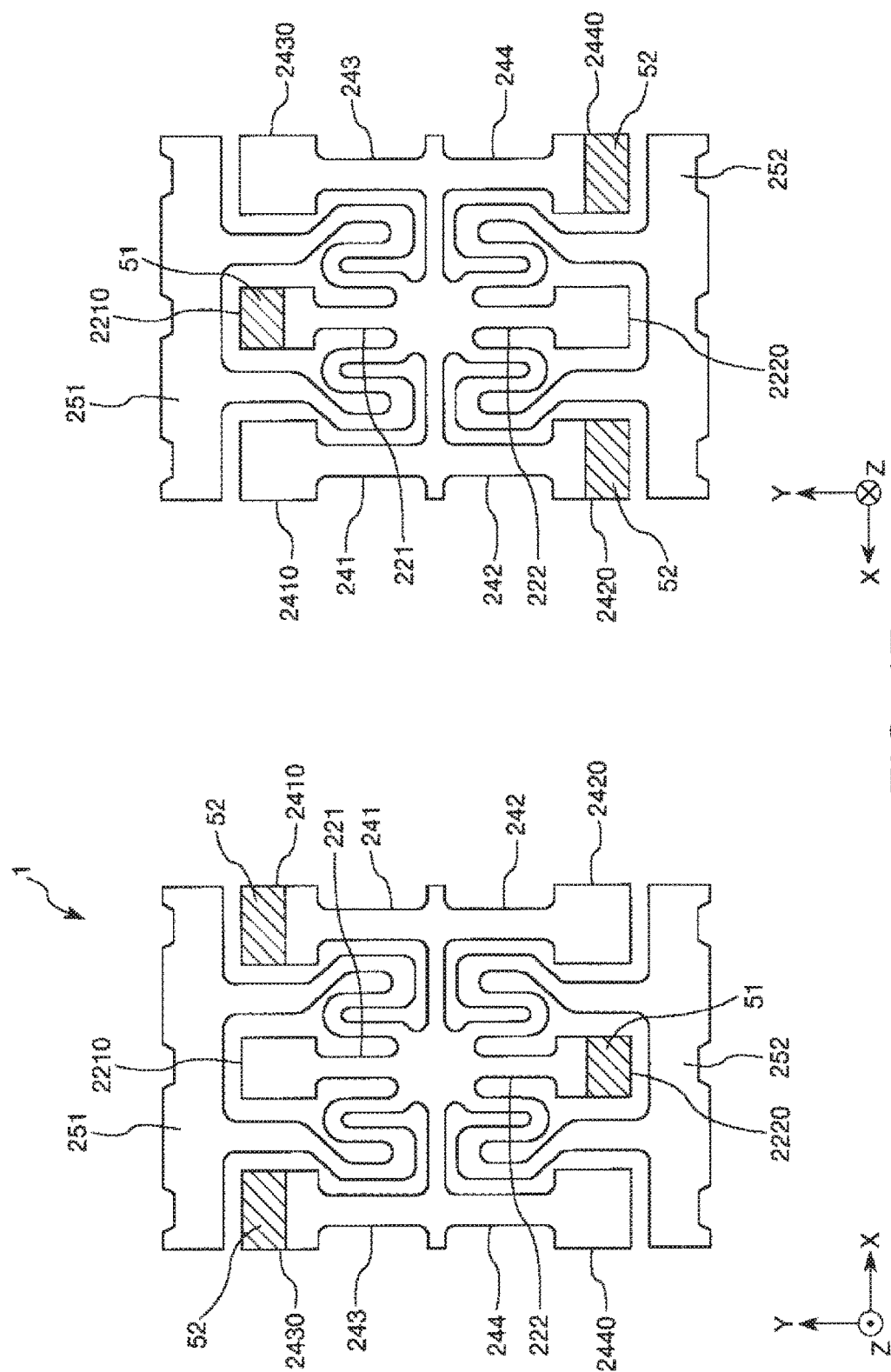
FIG. 17 is a top view and a bottom view showing a modified example of the physical quantity detection vibrator element shown in FIG. 15.
Figure 18:
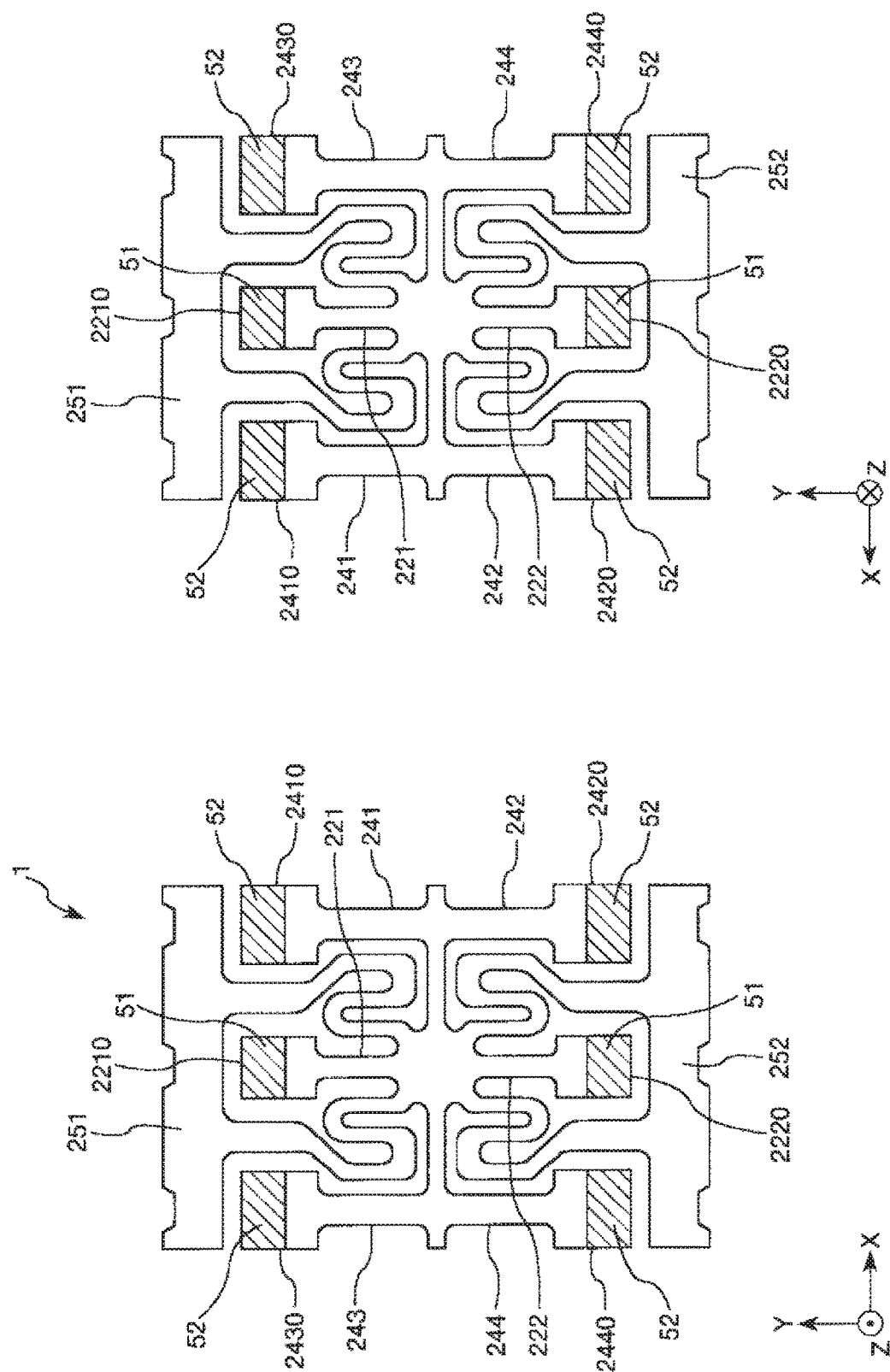
FIG. 18 is a top view and a bottom view showing a modified example of the physical quantity detection vibrator element shown in FIG. 15.

FIG. 15 is a top view and a bottom view of a physical quantity detection vibrator element according to the fourth embodiment of the invention. FIG. 16 is a sectional view showing centers of gravity of arms. FIGS. 17 and 18 are respectively top views and bottom views showing modified examples of the physical quantity detection vibrator element shown in FIG. 15. Note that, in FIGS. 15, 17, and 18, for convenience of explanation, illustration of electrodes, wires, terminals, groove portions, stepped portions is omitted.

As below, the physical quantity detection vibrator element of the fourth embodiment will be explained with a focus on the differences from the above described embodiments and the explanation of the same items will be omitted.

The physical quantity detection vibrator element of the fourth embodiment is the same as the physical quantity detection vibrator element of the above described first embodiment mainly except that weight portions are provided. Note that, in FIGS. 15 to 18, the same configurations as those of the above described embodiment have the same signs.

In the vibrator element 1 of the embodiment, wider portions (hammer heads) 2210 and 2220 having larger widths are provided in the tip end portions of the detection arms 221 and 222, and wider portions (hammerheads) 2410, 2420, 2430, and 2440 having larger widths are provided in the tip end portions of the drive arms 241, 242, 243, and 244. These wider portions are also provided in the above described first embodiment, however, the wider portions are not particularly explained in the first embodiment.

Further, weight portions 51 for adjustment of the resonance frequency of the detection vibration mode are provided in the wider portions 2210 and 2220, and weight portions 52 for adjustment of the resonance frequency of the drive vibration mode are provided in the wider portions 2410, 2420, 2430, and 2440. For example, the resonance frequency and the vibration balance in the detection vibration mode may be adjusted by removal of parts of the weight portions 51 using laser irradiation or the like to change the masses of the detection arms 221 and 222, and similarly, the resonance frequency and the vibration balance in the drive vibration mode may be adjusted by removal of parts of the weight portions 52 using laser irradiation or the like to change the masses of the drive arms 241, 242, 243, and 244. Note that the weight portions 51 and 52 may be formed by, for example, metal films.

Here, of the six arms 221, 222, 241, 242, 243, and 244, in the three arms 221, 241, and 243 located on the +Y-axis side with respect to the axis Jx, the weight portions (first weight portions) 51 and 52 are provided on the upper surfaces (one surfaces) of the wider portions 2210, 2410, and 2430. In the three arms 222, 242, and 244 located on the −Y-axis side with respect to the axis Jx, the weight portions (second weight portions) 51 and 52 are provided on the lower surfaces (the other surfaces) of the wider portions 2220, 2420, and 2440. Accordingly, as shown in FIG. 16, in the arms 221, 241, and 243, the centers of gravity Ga of the arms including the electrodes and the weight portions are deflected from the axes of the arms (center lines Lx) toward the +Z-axis side. Additionally in the arms 222, 242, 244, the centers of gravity Gb of the arms including the electrodes and the weight portions are deflected (moved) from the axes of the arms (center lines Lx) toward the −Z-axis side. The weight portions 51 and 52 are arranged as described above, and thereby, symmetry of the vibrator element 1 with respect to the XY-plane is improved and cross-axis sensitivity may be reduced. Accordingly, the detection sensitivity for angular velocity is improved.

According to the fourth embodiment, the same effects as those of the above described first embodiment may be exerted.

Note that, as a modified example of the embodiment, for example, as shown in FIG. 17, the detection arms 221 and 222 may have configurations in which the arrangement of the weight portions 51 is reversed to that of the embodiment. In other words, the weight portions 51 may be provided on the lower surface of the wider portion 2210 and the upper surface of the wider portion 2220.

Further, as another modified example shown in FIG. 18, the weight portions 51 may be provided on the upper surfaces and the lower surfaces of the wider portions 2210 and 2220 and the weight portions 52 may be provided on the upper surfaces and the lower surfaces of the wider portions 2410, 2420, 2430, and 2440. Thereby, the centers of gravity of the arms 221, 222, 241, 242, 243, and 244 including the electrodes and the weight portions may be aligned with the axes of the arms (center lines Lx). Accordingly, symmetry of the vibrator element 1 with respect to the XY-plane is improved and the cross-axis sensitivity may be reduced.

Fifth Embodiment

FIG. 19 is a top view and a bottom view of a physical quantity detection vibrator element according to the fifth embodiment of the invention.

As below, the physical quantity detection vibrator element of the fifth embodiment will be explained with a focus on the differences from the above described embodiments and the explanation of the same items (elements) will be omitted.

The physical quantity detection vibrator element of the fifth embodiment is the same as the physical quantity detection vibrator element of the above described first embodiment mainly except that the configurations of the drive arms are different. Note that, in FIG. 19, the same configurations as those of the above described embodiments have the same signs (i.e., elements similar to those of the above embodiments are given similar reference characters and are described above).

As shown in FIG. 19, in the drive arm 241 of the embodiment, the tip ends of the stepped portions 2413 and 2414 are located closer to the tip end side of the drive arm 241 than the tip ends of the groove portions 2411 and 2412. Though not illustrated, the same applies to the other drive arms 242, 243, and 244. By the configurations, asymmetric parts of the respective drive arms 241, 242, 243, and 244 may be made longer, and thereby, in the drive vibration mode, the drive arms 241 to 244 may be smoothly obliquely vibrated. Note that, letting the lengths of the groove portions 2411 and 2412 be L1 and the lengths of the stepped portions 2413 and 2414 be L2, it is preferable that L1 and L2 satisfy a relationship of $L1<L2 \leq 1.5L1$.

According to the fifth embodiment, the same effects as those of the above described first embodiment may be exerted.

Physical Quantity Detection Apparatus

Next, a physical quantity detection apparatus including the physical quantity detection vibrator element according to the invention will be explained.

Figure 20:
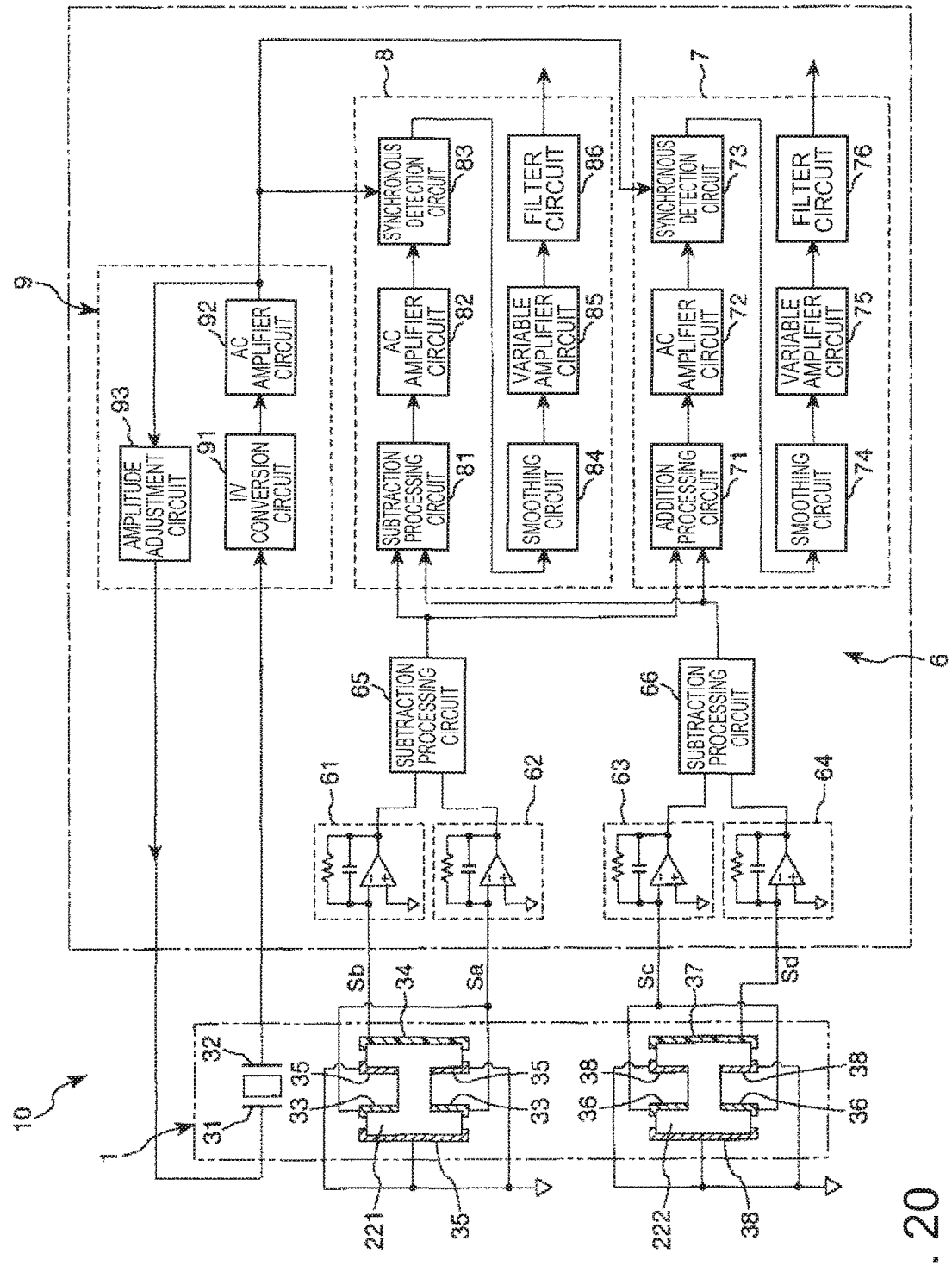
FIG. 20 is a block diagram showing a physical quantity detection apparatus according to the invention.

FIG. 20 is a block diagram showing a physical quantity detection apparatus according to the invention.

As shown in FIG. 20, a physical quantity detection apparatus 10 has the vibrator element 1, a drive circuit 9 for drive-vibrating the vibrator element 1, and a detection circuit 6 for detecting detection vibrations of the vibrator element 1 when an angular velocity is applied. Note that the drive circuit 9 and the detection circuit 6 may be realized using a single-chip IC or respectively realized using separate IC chips.

The drive circuit 9 has an I/V conversion circuit (current-voltage conversion circuit) 91, an AC amplifier circuit 92, and an amplitude adjustment circuit 93. The drive circuit 9 is a circuit that outputs signals for driving the drive arms 241 to 244 to the drive signal electrodes 31 of the vibrator element 1, and signals output from the drive ground electrodes 32 of the vibrator element 1 are input to the circuit.

When the drive arms 241 to 244 of the vibrator element 1 vibrate, alternating currents according to the piezoelectric effect are output from the drive ground electrodes 32 and input to the I/V conversion circuit 91. The I/V conversion circuit 91 converts and outputs the input alternating currents into alternating-current voltage signals at the same frequencies as the vibration frequencies of the drive arms 241 to 244. The alternating-current voltage signals output from the I/V conversion circuit 91 are input to the AC amplifier circuit 92. The AC amplifier circuit 92 amplifies and outputs the input alternating-current voltage signals.

The alternating-current voltage signals output from the AC amplifier circuit 92 are input to the amplitude adjustment circuit 93. The amplitude adjustment circuit 93 controls gain to hold the amplitudes of the input alternating-current voltage signals at a constant value and outputs the alternating-current voltage signals after the gain control to the drive signal electrodes 31 of the vibrator element 1. By the alternating-current voltage signals (drive signals) input to the drive signal electrodes 31, the drive arms 241 to 244 vibrate in the drive vibration mode.

The detection circuit 6 has charge amplifiers 61, 62, 63, 64, subtraction processing circuits 65, 66, a Y-axis angular velocity detection unit 7, and a Z-axis angular velocity detection unit 8. The detection circuit 6 is a circuit that detects the angular velocity ωy and the angular velocity ωz based on the signals respectively output from the detection signal electrodes 33, 34, 36, 37 of the vibrator element 1.

The charge amplifier 61 (first current-voltage conversion unit) includes an operational amplifier, a feedback resistor, and a feedback capacitor, and the detection signals output from the second detection signal electrode 34 of the detection arm 221 (the detection signal output from the third electrode portion 341 and the detection signal output from the fourth electrode portion 342) Sb are input to an inverting input terminal (minus terminal) of the operational amplifier, and a non-inverting input terminal (plus terminal) of the operational amplifier is fixed to the reference potential. The charge amplifier 61 converts the detection signals input to the operational amplifier into alternating-current voltage signals.

The charge amplifier 62 (second current-voltage conversion unit) includes an operational amplifier, a feedback resistor, and a feedback capacitor, and the detection signals output from the first detection signal electrode 33 of the detection arm 221 (the detection signal output from the first electrode portion 331 and the detection signal output from the second electrode portion 332) Sa are input to an inverting input terminal (minus terminal) of the operational amplifier, and a non-inverting input terminal (plus terminal) of the operational amplifier is fixed to the reference potential. The charge amplifier 62 converts the detection signals input to the operational amplifier into alternating-current voltage signals.

Note that the detection signal Sa and the detection signal Sb have opposite electrical characteristics.

The output signal of the charge amplifier 61 and the output signal of the charge amplifier 62 are input to the subtraction processing circuit (differential amplifier circuit) 65. The subtraction processing circuit 65 functions as a differential amplification unit that differential-amplifies the output signal of the vibrator element 1, and outputs a signal formed by amplification (differential amplification) of the potential difference between the output signal of the charge amplifier 61 and the output signal of the charge amplifier 62. An output signal S' of the subtraction processing circuit 65 is input to the Y-axis angular velocity detection unit 7 and the Z-axis angular velocity detection unit 8.

The charge amplifier 63 (third current-voltage conversion unit) includes an operational amplifier, a feedback resistor, and a feedback capacitor, and the detection signals output from the third detection signal electrode 36 of the detection arm 222 (the detection signal output from the first electrode portion 361 and the detection signal output from the second electrode portion 362) Sc are input to an inverting input terminal (minus terminal) of the operational amplifier, and a non-inverting input terminal (plus terminal) of the operational amplifier is fixed to the reference potential. The charge amplifier 63 converts the detection signals input to the operational amplifier into alternating-current voltage signals.

The charge amplifier 64 (fourth current-voltage conversion unit) includes an operational amplifier, a feedback resistor, and a feedback capacitor, and the detection signals output from the fourth detection signal electrode 37 of the detection arm 222 (the detection signal output from the third electrode portion 371 and the detection signal output from the fourth electrode portion 372) Sd are input to an inverting input terminal (minus terminal) of the operational amplifier, and a non-inverting input terminal (plus terminal) of the operational amplifier is fixed to the reference potential. The charge amplifier 64 converts the detection signals input to the operational amplifier into alternating-current voltage signals.

Note that the detection signal Sc and the detection signal Sd have opposite electrical characteristics.

The output signal of the charge amplifier 63 and the output signal of the charge amplifier 64 are input to the subtraction processing circuit (differential amplifier circuit) 66. The subtraction processing circuit 66 functions as a differential amplification unit that differential-amplifies the output signal of the vibrator element 1, and outputs a signal formed by amplification (differential amplification) of the potential difference between the output signal of the charge amplifier 63 and the output signal of the charge amplifier 64. An output signal S" of the subtraction processing circuit 66 is input to the Y-axis angular velocity detection unit 7 and the Z-axis angular velocity detection unit 8.

The Y-axis angular velocity detection unit 7 has an addition processing circuit 71, an AC amplifier circuit 72, a synchronous detection circuit 73, a smoothing circuit 74, a variable amplifier circuit 75, and a filter circuit 76.

The output signal S' of the subtraction processing circuit 65 and the output signal S" of the subtraction processing circuit 66 are input to the addition processing circuit 71. The addition processing circuit 71 functions as an addition amplification unit that adds and amplifies the output signal of the vibrator element 1, adds the potentials of the output signal S' of the subtraction processing circuit 65 and the output signal S" of the subtraction processing circuit 66, and outputs the amplified signal. The output signal of the addition processing circuit 71 is input to the AC amplifier circuit 72.

The AC amplifier circuit 72 functions as an AC amplification unit that amplifies an AC signal and outputs a signal formed by amplification of the output signal of the addition processing circuit 71. The output signal of the AC amplifier circuit 72 is input to the synchronous detection circuit 73. The synchronous detection circuit 73 extracts an angular velocity component about the Y-axis by synchronous detection of the output signal of the AC amplifier circuit 72 based on the alternating-current voltage signal output by the AC amplifier circuit 92 of the drive circuit 9.

The signal of the angular velocity component about the Y-axis extracted by the synchronous detection circuit 73 is smoothed into a direct-current voltage signal by the smoothing circuit 74 and input to the variable amplifier circuit 75. The variable amplifier circuit 75 amplifies (or attenuates) the output signal (direct-current voltage signal) of the smoothing circuit 74 at a set amplification factor (or attenuation factor) to change angular velocity sensitivity. The signal amplified (or attenuated) by the variable amplifier circuit 75 is input to the filter circuit 76.

The filter circuit 76 attenuates high-frequency noise components outside of the sensor range from the output signal of the variable amplifier circuit 75 (precisely, attenuates the components to a predetermined level or less) and outputs a detection signal with polarity and at a voltage level according to the direction and the magnitude of the angular velocity about the Y-axis. Then, the detection signal is output from an external output terminal (not shown) to the outside.

The Z-axis angular velocity detection unit 8 has a subtraction processing circuit 81, an AC amplifier circuit 82, a synchronous detection circuit 83, a smoothing circuit 84, a variable amplifier circuit 85, and a filter circuit 86.

The output signal S' of the subtraction processing circuit 65 and the output signal S" of the subtraction processing circuit 66 are input to the subtraction processing circuit 81. The subtraction processing circuit 81 functions as a differential amplification unit that differential-amplifies the output signal of the vibrator element 1, and outputs a signal formed by amplification (differential amplification) of the potential difference between the output signal S' of the subtraction processing circuit 65 and the output signal S" of the subtraction processing circuit 66. The output signal of the subtraction processing circuit 81 is input to the AC amplifier circuit 82.

The AC amplifier circuit 82 functions as an AC amplification unit that amplifies an AC signal and outputs a signal formed by amplification of the output signal of the subtraction processing circuit 81. The output signal of the AC amplifier circuit 82 is input to the synchronous detection circuit 83. The synchronous detection circuit 83 extracts an angular velocity component about the Z-axis by synchronous detection of the output signal of the AC amplifier circuit 82 based on the alternating-current voltage signal output by the AC amplifier circuit 92 of the drive circuit 9.

The signal of the angular velocity component about the Z-axis extracted by the synchronous detection circuit 83 is smoothed into a direct-current voltage signal by the smoothing circuit 84 and input to the variable amplifier circuit 85. The variable amplifier circuit 85 amplifies (or attenuates) the output signal (direct-current voltage signal) of the smoothing circuit 84 at a set amplification factor (or attenuation factor) to change angular velocity sensitivity. The signal amplified (or attenuated) by the variable amplifier circuit 85 is input to the filter circuit 86.

The filter circuit 86 attenuates high-frequency noise components outside of the sensor range from the output signal of the variable amplifier circuit 85 (precisely, attenuates the components to a predetermined level or less) and outputs a detection signal with polarity and at a voltage level according to the direction and the magnitude of the angular velocity about the Z-axis. Then, the detection signal is output from an external output terminal (not shown) to the outside.

Electronic Apparatuses

Next, electronic apparatuses including the physical quantity detection vibrator elements according to the invention will be explained.

Figure 21:
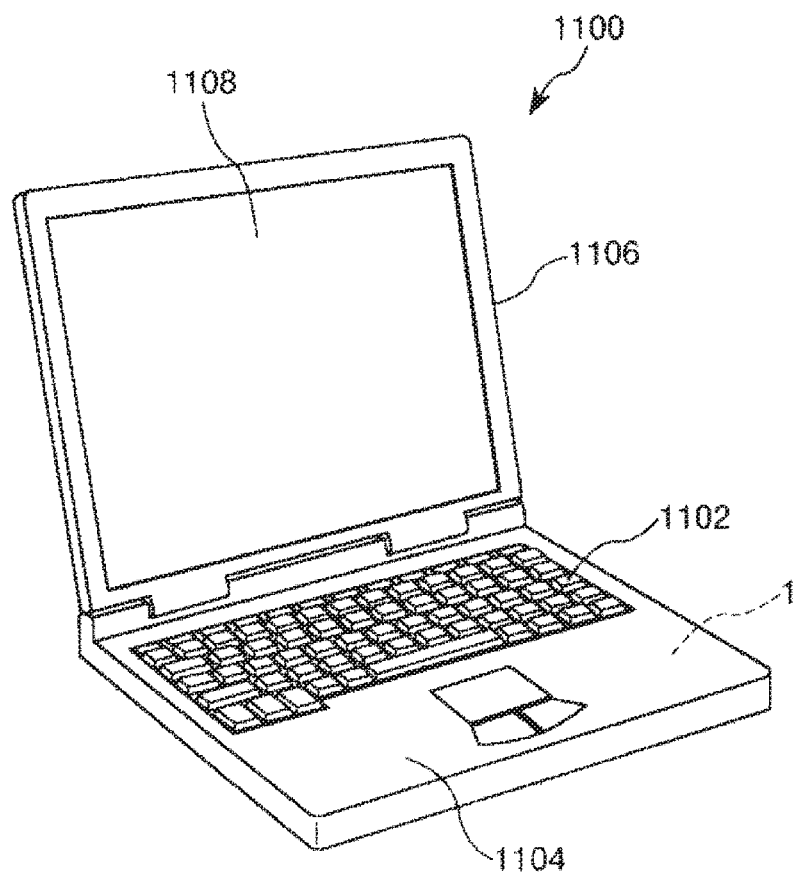
FIG. 21 is a perspective view showing a configuration of a mobile (or notebook) personal computer to which an electronic apparatus according to the invention is applied.

FIG. 21 is a perspective view showing a configuration of a mobile (or notebook) personal computer to which an electronic apparatus according to the invention is applied.

In the drawing, a personal computer 1100 includes a main body part 1104 having a keyboard 1102 and a display unit 1106 having a display part 1108, and the display unit 1106 is rotatably supported with respect to the main body part 1104 via a hinge structure portion. The personal computer 1100 contains the vibrator element 1.

Figure 22:
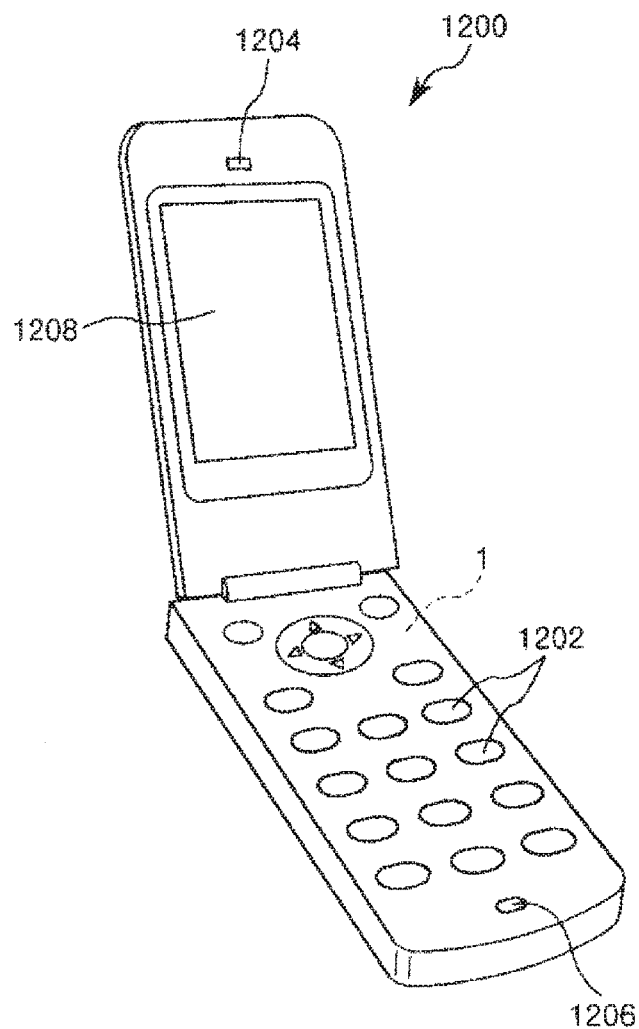
FIG. 22 is a perspective view showing a configuration of a cell phone (including Personal Handy-phone System, PHS) to which an electronic apparatus according to the invention is applied.

FIG. 22 is a perspective view showing a configuration of a cell phone (including Personal Handy-phone System, PHS) to which an electronic apparatus according to the invention is applied.

In the drawing, a cell phone 1200 includes an antenna (not shown), a plurality of operation buttons 1202, and an earpiece 1204 and a mouthpiece 1206, and a display part 1208 is provided between the operation buttons 1202 and the earpiece 1204. The cell phone 1200 contains the vibrator element 1.

Figure 23:
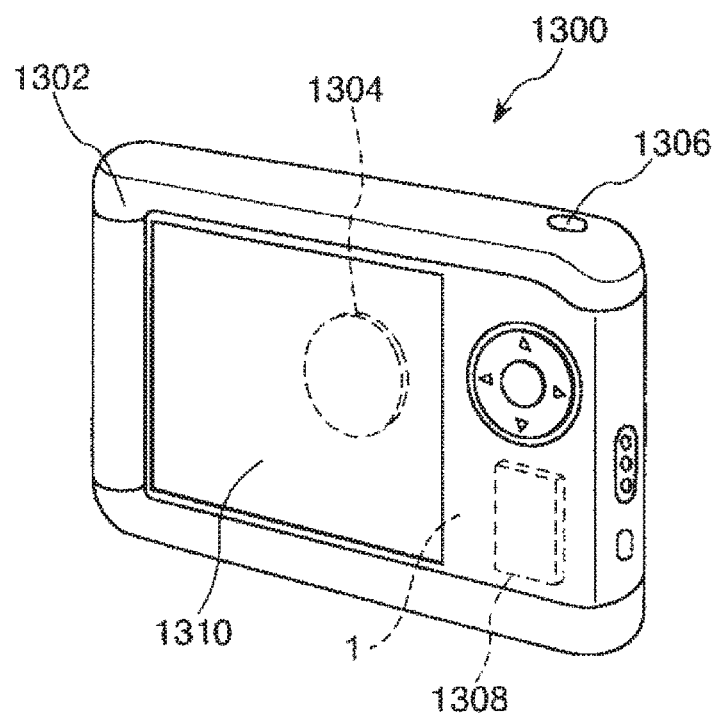
FIG. 23 is a perspective view showing a configuration of a digital still camera to which an electronic apparatus according to the invention is applied.

FIG. 23 is a perspective view showing a configuration of a digital still camera to which an electronic apparatus according to the invention is applied.

A display part 1310 is provided on the rear surface of a case (body) 1302 in a digital still camera 1300 and the camera is adapted to display based on imaging signals by a CCD, and the display part 1310 functions as a finder that displays a subject as an electronic image. Further, a light receiving unit 1304 including an optical lens (imaging system) and the CCD is provided on the front side (the rear side in the drawing) of the case 1302. A photographer checks a subject image displayed on the display part 1310 and presses a shutter button 1306, and then, the imaging signals of the CCD at the moment are transferred and stored in a memory 1308. The digital still camera 1300 contains the vibrator element 1 used for hand shake correction, for example.

The electronic apparatuses include the vibrator elements 1 and have the better reliability.

The electronic apparatus according to the invention may be applied to the personal computer in FIG. 21, the cell phone in FIG. 22, and the digital still camera in FIG. 23, and additionally, smartphones, tablet terminals, clocks (including smartwatches), inkjet ejection apparatuses (e.g. inkjet printers), laptop personal computers, televisions, wearable terminals such as HMDs (head mounted displays), video cameras, video tape recorders, car navigation apparatuses, pagers, personal digital assistances (with or without communication function), electronic dictionaries, calculators, electronic game apparatuses, word processors, work stations, videophones, security television monitors, electronic binoculars, POS terminals, medical apparatuses (e.g., electronic thermometers, sphygmomanometers, blood glucose meters, electrocardiographic measurement apparatuses, ultrasonic diagnostic apparatuses, or electronic endoscopes), fish finders, various measurement instruments, meters and gauges (e.g., meters for vehicles, airplanes, and ships), flight simulators, etc.

Moving Object

Next, a moving object including the physical quantity detection vibrator element according to the invention will be explained.

Figure 24:
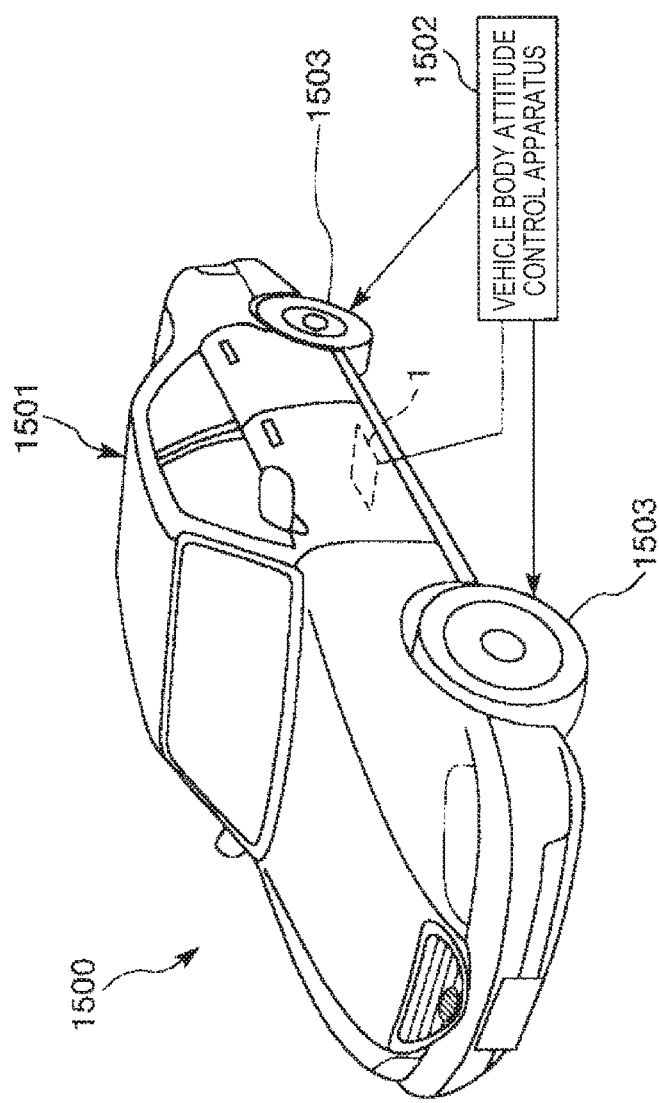
FIG. 24 is a perspective view showing an automobile to which a moving object according to the invention is applied.

FIG. 24 is a perspective view showing an automobile to which a moving object according to the invention is applied.

As shown in FIG. 24, an automobile 1500 contains the vibrator element 1 and, for example, may detect the attitude of a vehicle body 1501 using the vibrator element 1. The detection signal of the vibrator element 1 is supplied to a vehicle body attitude control apparatus 1502 and the vehicle body attitude control apparatus 1502 detects the attitude of the vehicle body 1501 based on the signal, and thereby, may control hardness of the suspension according to the detection result and control the brakes of the individual wheels 1503. In addition, the attitude control may be used in a bipedal walking robot or radio control helicopter (including drone). As described above, for realization of the attitude control of various moving objects, the vibrator element 1 is incorporated.

As above, the physical quantity detection vibrator element, the physical quantity detection apparatus, the electronic apparatus, and the moving object according to the invention are explained according to the illustrated embodiments, however, the invention is not limited to those. The configurations of the respective parts may be replaced by arbitrary configurations having the same functions. Further, another arbitrary configuration may be added to the invention.

Note that, in the above described embodiments, the physical quantity detection vibrator element has the supporting portions and the beam portions supporting the base part, however, these supporting portions and beam portions may be omitted. In this case, the respective terminals may be provided in the base part.

The entire disclosure of Japanese Patent Application No. 2015-211602, filed Oct. 28, 2015 is expressly incorporated by reference herein.

What is claimed is:

1. A physical quantity detection vibrator element comprising:
    a detection arm that includes a piezoelectric material, performs a drive vibration in a first direction, and performs a detection vibration in second direction orthogonal to the first direction when a physical quantity is applied thereto; and
    a first detection signal electrode, a second detection signal electrode, and a reference potential electrode provided on the detection arm;
    wherein:
    the first detection signal electrode includes a first electrode portion and a second electrode portion;
    the second detection signal electrode includes a third electrode portion and a fourth electrode portion;
    the reference potential electrode includes:
        (a) a first reference potential electrode portion at a reference potential with respect to the first electrode portion;
        (b) a second reference potential electrode portion at the reference potential with respect to the second electrode portion;
        (c) a third reference potential electrode portion at the reference potential with respect to the third electrode portion; and
        (d) a fourth reference potential electrode portion at the reference potential with respect to the fourth electrode portion;
    a first signal generated between the first electrode portion and the first reference potential electrode portion and a second signal generated between the second electrode portion and the second reference potential electrode portion are in opposite phase with each other when the drive vibration is performed and in phase with each other when the detection vibration is performed; and
    a third signal generated between the third electrode portion and the third reference potential electrode portion and a fourth signal generated between the fourth electrode portion and the fourth reference potential electrode portion are in opposite phase with each other when the drive vibration is performed and in phase with each other when the detection vibration is performed.

2. The physical quantity detection vibrator element according to claim 1, wherein a first plane is defined normal the first direction and the detection arm further includes:
    a first projection portion projecting away from the first plane on one side of the first plane;
    a second projection portion projecting away from the first plane on the other side of the first plane;
    a third projection portion projecting away from the first plane on the one side of the first plane beside the first projection portion; and
    a fourth projection portion projecting away from the first plane on the other side of the first plane beside the second projection portion,
    wherein the first electrode portion and the first reference potential electrode portion are provided with the first projection portion in between,
    the second electrode portion and the second reference potential electrode portion are provided with the second projection portion in between,
    the third electrode portion and the third reference potential electrode portion are provided with the third projection portion in between, and
    the fourth electrode portion and the fourth reference potential electrode portion are provided with the fourth projection portion in between.

3. The physical quantity detection vibrator element according to claim 1, further comprising:
    a pair of drive arms provided with the detection arm in between; and
    a base part connected to the detection arm and to the pair of drive arms.

4. The physical quantity detection vibrator element according to claim 3, further comprising a second detection arm with the base part located in between the detection arms.

5. The physical quantity detection vibrator element according to claim 3, wherein a first plane is defined normal the first direction, a second plane is defined normal the second direction, and each of the drive arms includes:
    a drive arm first principal surface provided on one side of the first plane;
    a drive arm second principal surface provided on the other side of the first plane,
    a drive arm first side surface provided on one side of the second plane;
    a drive arm second side surface provided on the other side of the second plane;
    a drive arm first groove portion provided in the drive arm first principal surface;
    a drive arm second groove portion provided in the drive arm second principal surface;
    a first step portion located in the drive arm first groove portion on the one side of the second plane and connecting the drive arm first principal surface and the drive arm first side surface; and
    a second step portion located in the drive arm second groove portion on the other side of the second plane and connecting the drive arm second principal surface and the drive arm second side surface,
    a tip end of the first stepped portion in a third direction orthogonal to the first direction and second direction is located closer to a tip end side of the drive arm than a tip end of the drive arm first groove portion in the third direction; and a tip end of the second stepped portion in the third direction is located closer to a tip end side of the drive arm than a tip end of the drive arm second groove portion in the third direction.

6. A physical quantity detection apparatus comprising:
the physical quantity detection vibrator element according to claim 1; and
a circuit electrically connected to the physical quantity detection vibrator element.

7. An electronic apparatus comprising the physical quantity detection vibrator element according to claim 1.

8. A moving object comprising the physical quantity detection vibrator element according to claim 1.

9. The physical quantity detection vibrator element according to claim 1, further comprising:
a base part;
a pair of the detection arms extending from the base part in opposite directions along a third direction orthogonal to the first direction and second direction;
a pair of connecting arms extend from the base in opposite directions parallel to the second plane;
a first pair of drive arms extend from one connecting arm in opposite directions parallel to the first plane; and
a second pair of drive arms extend from the other of the pair of connecting arms in opposite directions to each other along the first plane.

10. The physical quantity detection vibrator element according to claim 9, further comprising:
a first weight portion provided on a surface of the one detection arms on one side of the first plane; and
a second weight portion provided on a surface of the other detection arms on the other side of the first plane.

11. A physical quantity detection vibrator element comprising:
a detection arm that includes a piezoelectric material, performs a drive vibration in a first direction, and performs a detection vibration in a second direction orthogonal to the first directions when a physical quantity is applied thereto; and
a first detection signal electrode and a second detection signal electrode provided on the detection arm;
wherein:
the first detection signal electrode includes a first electrode portion and a second electrode portion;
the second detection signal electrode includes a third electrode portion and a fourth electrode portion;
a signal generated between the first electrode portion and the third electrode portion and a signal generated between the second electrode portion and the third electrode portion are in opposite phase with each other when the drive vibration is performed and in phase with each other when the detection vibration is performed; and
a signal generated between the first electrode portion and the fourth electrode portion and a signal generated between the second electrode portion and the fourth electrode portion are in opposite phase with each other when the drive vibration is performed and in phase with each other when the detection vibration is performed.

12. The physical quantity detection vibrator element according to claim 11,
wherein a first plane is defined normal the first direction, a second plane is defined normal the second direction, and the detection arm includes:

a detection arm first principal surface provided on one side of the first plane;
a detection arm second principal surface provided on the other side of the first plane;
a detection arm first side surface provided on one side of the second plane;
a detection arm second side surface provided on the other side of the second plane;
a detection arm first groove portion opening in the detection arm first principal surface; and
a detection arm second groove portion opening in the detection arm second principal surface;
wherein:
the first electrode portion is provided in the detection arm first groove portion;
the second electrode portion is provided in the detection arm second groove portion;
the third electrode portion is provided on the detection arm first side surface; and
the fourth electrode portion is provided on the detection arm second side surface.

13. The physical quantity detection vibrator element according to claim 11, further comprising:
a pair of drive arms provided with the detection arm in between; and
a base part connected to the detection arm and to the pair of drive arms are connected.

14. The physical quantity detection vibrator element according to claim 13, further comprising a second detection arm with the base part located in between the detection arms.

15. The physical quantity detection vibrator element according to claim 13, wherein each of the pair of drive arms includes:
a drive arm first principal surface provided on the one side of the first plane;
a drive arm second principal surface provided on the other side of the first plane;
a drive arm first side surface provided on the one side of the second plane;
a drive arm second side surface provided on the other side of the second plane;
a drive arm first groove portion provided in the drive arm first principal surface;
a drive arm second groove portion provided in the drive arm second principal surface;
a first step portion located in the drive arm first groove portion on the one side of the second plane and connecting the drive arm first principal surface and the drive arm first side surface; and
a second step portion located in the drive arm second groove portion on the other side of the second plane and connecting the drive arm second principal surface and the drive arm second side surface;
wherein:
a tip end of the first stepped portion in a third direction orthogonal to the first direction and second direction is located closer to a tip end side of the drive arm than a tip end of the drive arm first groove portion in the third direction; and
a tip end of the second stepped portion in the third direction is located closer to a tip end side of the drive arm than a tip end of the drive arm second groove portion in the third direction.

16. The physical quantity detection vibrator element according to claim 11, further comprising:
a base part;

each detection arm in the pair of the detection arms extends away from the base part in opposite directions along the third direction;

a pair of connecting arms extend from the base part on opposite sides of the second plane;

a first pair of drive arms extend from one of the connecting arms toward opposite sides of the first plane; and a second pair of drive arms extend from the other connecting arm toward opposite sides of the first plane.

17. The physical quantity detection vibrator element according to claim 16, further comprising:

a first weight portion provided on a surface of the one detection arm on one side of the first directions; and a second weight portion provided on a surface of the other detection arm on the other side of the first directions.

18. A physical quantity detection apparatus comprising:

the physical quantity detection vibrator element according to claim 11; and a circuit electrically connected to the physical quantity detection vibrator element.

19. An electronic apparatus comprising the physical quantity detection vibrator element according to claim 11.

20. A moving object comprising the physical quantity detection vibrator element according to claim 11.

* * * * *